(12) United States Patent
Guler et al.

(10) Patent No.: US 12,490,462 B2
(45) Date of Patent: Dec. 2, 2025

(54) ANGLED GATE OR DIFFUSION PLUGS

(71) Applicant: Intel Corporation, Santa Clara, CA (US)

(72) Inventors: Leonard P. Guler, Hillsboro, OR (US); Tsuan-Chung Chang, Portland, OR (US); Charles H. Wallace, Portland, OR (US); Peter P. Sun, Hillsboro, OR (US); Tahir Ghani, Portland, OR (US); Virupaxi Goornavar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 762 days.

(21) Appl. No.: 17/687,038

(22) Filed: Mar. 4, 2022

(65) Prior Publication Data

US 2023/0282724 A1   Sep. 7, 2023

(51) Int. Cl.

| H10D 30/67 | (2025.01) |
|---|---|
| H10D 84/01 | (2025.01) |
| H10D 84/03 | (2025.01) |
| H10D 84/83 | (2025.01) |

(52) U.S. Cl.
CPC ..... H10D 30/6735 (2025.01); H10D 84/0151 (2025.01); H10D 84/038 (2025.01); H10D 84/83 (2025.01); H10D 30/6757 (2025.01)

(58) Field of Classification Search
CPC ........... H10D 30/6735; H10D 84/0151; H10D 84/038; H10D 84/83; H10D 30/6757; H10D 30/797; H10D 30/014; H10D 30/43; H10D 64/017; H10D 62/822; H10D 62/121; H10D 84/0135; B82Y 10/00

See application file for complete search history.

(56) References Cited

U.S. PATENT DOCUMENTS

2015/0054031 A1* 2/2015 Glass .................. H10D 30/601
                                                                438/285
2021/0273072 A1* 9/2021 Lin ........................ H10D 30/43

* cited by examiner

*Primary Examiner* — Mohammad A Rahman
(74) *Attorney, Agent, or Firm* — Finch & Maloney PLLC

(57) ABSTRACT

Techniques are provided herein to form an integrated circuit having gate cut structures or plug structures between source or drain regions, with an angled cut made to the top portion of the structures. In an example, a semiconductor device includes a semiconductor region extending between source and drain regions, and a gate structure extending over the semiconductor region. A gate cut structure is present adjacent to the semiconductor device and interrupts the gate structure. The gate cut structure has a first width along a first plane that extends through the semiconductor region and a second width along a second plane parallel to the first plane and above the semiconductor region, where the first width is greater than the second width. Similar angled plug structures may be provided adjacent to the source and drain regions to increase the landing area made to the metal contacts on the source and drain regions.

20 Claims, 17 Drawing Sheets

ANGLED GATE OR DIFFUSION PLUGS

FIELD OF THE DISCLOSURE

The present disclosure relates to integrated circuits, and more particularly, to dielectric structures such as gate cut structures and dielectric plugs that separate adjacent source or drain regions.

BACKGROUND

As integrated circuits continue to scale downward in size, a number of challenges arise. For instance, reducing the size of memory and logic cells is becoming increasingly more difficult. Certain aspects of lithography technology can impose physical limits on dimensions of certain structures. Due to the high complexity and density of integrated circuit layouts, any structures that require tight alignment tolerances yield possible points of failure for the device. Accordingly, there remain a number of non-trivial challenges with respect to forming such high-density semiconductor devices.

Figure 1A:
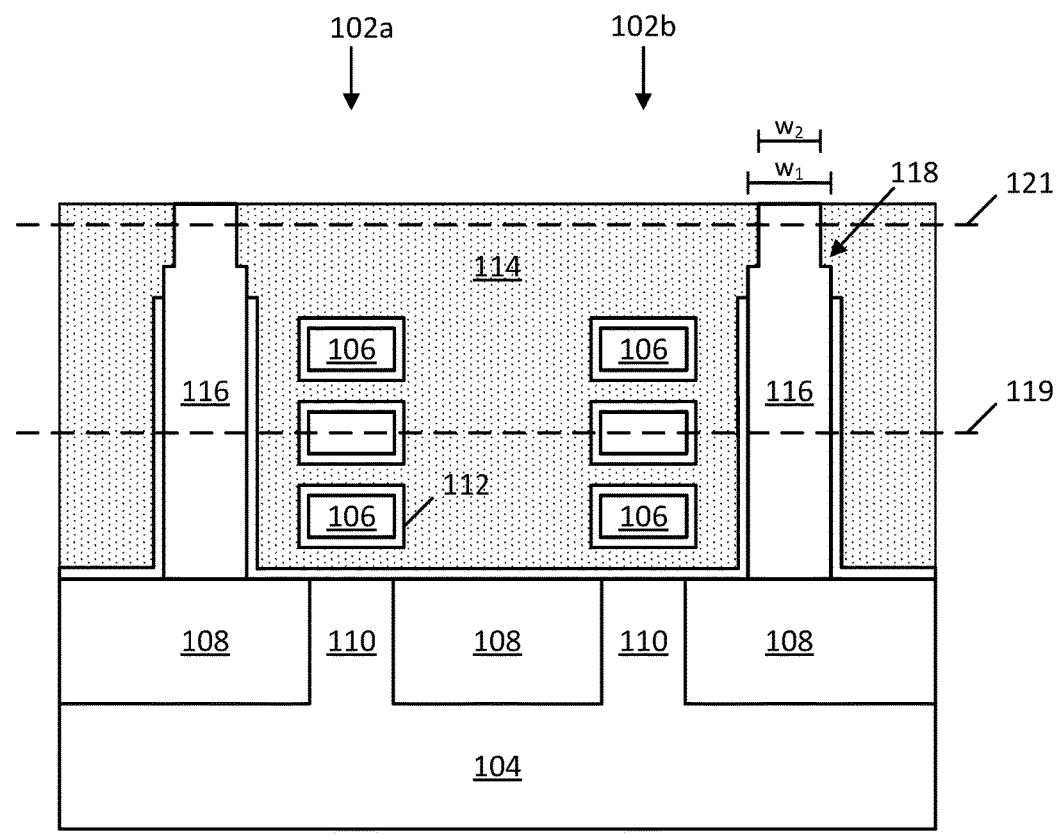
FIG. 1A is a cross-sectional view and FIG. 1B is a plan view of an integrated circuit including angled gate cut structures, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form an integrated circuit having gate cut structures and/or diffusion plug structures with an angled cut made to the top portion of the structures. The techniques can be used in any number of integrated circuit applications and are particularly useful with respect to logic and memory cells, such as those cells that use finFETs or gate-all-around transistors (e.g., ribbon-FETs and nanowire FETs). In an example, semiconductor devices include semiconductor regions extending between corresponding source and drain regions, and a gate structure extending over the semiconductor regions. In some such examples, one or more gate cut structures are present adjacent to a given semiconductor device and interrupting the gate structure. At least one of the gate cut structures has a first width along a first plane that extends through the one or more semiconductor regions and a second width along a second plane above the one or more semiconductor regions, where the first width is greater than the second width. Similar angled plug structures may be provided adjacent to the source and drain regions (sometimes called diffusion regions or epitaxial regions or epi regions) to increase the landing area made to the metal contacts on the source and drain regions. Numerous variations and embodiments will be apparent in light of this disclosure.

General Overview

As previously noted above, there remain a number of non-trivial challenges with respect to integrated circuit fabrication. In more detail, gate cut structures are sometimes provided between adjacent semiconductor devices to isolate portions of a gate structure that crosses over each of any number of adjacent semiconductor devices. Accordingly, gate cut structures can be used to define separate gate structures. As devices continue to scale smaller, thinner gate cut structures are desirable to leave as much room for landing a contact on the gate structure as possible. However, lithography constraints and shorting considerations can limit the total allowed width of such gate cut structures.

Thus, and in accordance with an embodiment of the present disclosure, techniques are provided herein to form gate cut structures having an angled top portion that reduces their critical dimension (CD). The reduction of the gate cut structure CD yields a corresponding increase to the landing area of an adjacent gate structure. In an embodiment, one or more gate cut structures are formed before the formation of adjacent conductive gate structures. Afterwards, portions of the gate structures are recessed and replaced with a sacrificial material that is also recessed to expose top portions of the gate cut structures. The exposed top portions are laterally etched using anisotropic or isotropic etching techniques, according to some embodiments. Once the lateral etching is complete, the sacrificial material is removed and conductive material is filled in again to complete the gate structure. The width of the gate structure is widened at the top of the gate cut structures as a result of the lateral etching. It should be understood that this process may also be performed at other locations around an integrated circuit to provide increased landing area for conductive contacts. For example, contacts formed over source and drain regions can be similarly widened at the top by performing the lateral etching process to adjacent dielectric plugs on either side of the source and drain regions.

According to an embodiment, an integrated circuit includes a semiconductor device having a semiconductor region extending between a source region and a drain region, a gate layer comprising a conductive material and extending over the semiconductor region, and a gate cut structure comprising a dielectric material and adjacent to the semiconductor region such that the gate cut structure interrupts the gate layer. The gate cut structure has a first width along a first plane that extends through the semiconductor region and a second width along a second plane parallel to the first plane and above the semiconductor region where the first width is greater than the second width.

According to another embodiment, an integrated circuit includes one or more semiconductor devices having one or more semiconductor regions extending between corresponding source regions and drain regions, a gate layer comprising a conductive material and extending over the one or more semiconductor regions, a first gate cut structure comprising a first dielectric material, and a second gate cut structure comprising a second dielectric material. The first gate cut structure is adjacent to at least one of the one or more semiconductor regions such that the first gate cut structure interrupts the gate layer and the second gate cut structure is adjacent to at least one of the one or more semiconductor regions such that the second gate cut structure interrupts the gate layer. The gate layer has a first width between the first gate cut structure and the second gate cut structure along a first plane that extends through the one or more semiconductor regions and a second width along a second plane parallel to the first plane and above the one or more semiconductor regions between the first gate cut structure and the second gate cut structure where the second width is greater than the first width.

According to another embodiment, a method of forming an integrated circuit includes: forming a plurality of fins comprising semiconductor material, wherein the plurality of fins extend parallel to one another; forming a sacrificial gate layer over the semiconductor material of the plurality of fins; forming a gate cut structure comprising a dielectric material through the sacrificial gate layer; replacing the sacrificial gate layer with a first conductive gate layer; recessing a portion of the conductive gate layer adjacent to the gate cut structure; forming mask material over the conductive gate layer; laterally etching an exposed portion of the gate cut structure above a top surface of the mask material; and removing the mask material and forming a second conductive gate layer on the first conductive layer and adjacent to the laterally etched portion of the gate cut structure.

The techniques can be used with any type of non-planar transistors, including finFETs (sometimes called double-gate transistors, or tri-gate transistors), or nanowire and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process), or any other gate formation process. Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate an atypical change in width near the top of gate cut structures. This change in width may be an abrupt transition observable as a shoulder or step-like feature, or a less abrupt gradual or sloped change in width. Similarly, an increase in the width of the top portion of the conductive gate layer may be observed between gate cut structures.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view taken across a plurality of semiconductor devices 102a and 102b, according to an embodiment of the present disclosure. Each of semiconductor devices 102a and 102b may be non-planar metal oxide semiconductor (MOS) transistors, such as tri-gate or gate-all-around (GAA) transistors, although other transistor topologies and types could also benefit from the techniques provided herein. The examples herein illustrate semiconductor devices with a GAA structure (e.g., having nanoribbons that extend between source and drain regions).

As can be seen, semiconductor devices 102a and 102b are formed over a substrate 104. Any number of semiconductor devices can be formed on or over substrate 104, but two are used here as an example. Substrate 104 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 104 can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, substrate 104 is removed from the backside and replaced with one or more backside interconnect layers to provide backside power and signal routing.

Each of semiconductor devices 102a and 102b includes one or more nanoribbons 106 that extend parallel to one another along a first direction between a source region and a drain region (e.g., into and out of the page in the cross-section view of FIG. 1A). Nanoribbons 106 are one example of semiconductor regions that extend between source and drain regions. The term nanoribbon may also encompass other similar shapes such as nanowires or nanosheets. The semiconductor material of nanoribbons 106 may be formed from substrate 104. In some embodiments, semiconductor devices 102a and 102b may each include semiconductor regions in the shape of fins that can be, for example, native to substrate 104 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 106 during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches.

As can further be seen, adjacent semiconductor devices are separated by a dielectric fill 108 that may include silicon oxide. Dielectric fill 108 provides shallow trench isolation (STI) between any adjacent semiconductor devices. Dielectric fill 108 can be any suitable dielectric material, such as silicon dioxide, aluminum oxide, or silicon oxycarbonitride.

Semiconductor devices 102a and 102b each include a subfin region 110. According to some embodiments, subfin region 110 comprises the same semiconductor material as substrate 104 and is adjacent to dielectric fill 108. According to some embodiments, nanoribbons 106 (or other semiconductor structures) are present above the top surface of subfin region 110 and provide an active region for each transistor (e.g., the semiconductor region beneath the gate).

As noted above, nanoribbons 106 extend between a source region and a drain region. The source and drain regions are not shown in this particular cross-section. According to some embodiments, the source and drain regions are epitaxial regions that are provided on the ends of the fins or nanoribbons in an etch-and-replace process. In other embodiments one or both of the source and drain regions could be, for example, implantation-doped native portions of the fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a gate structure extends over nanoribbons 106 of corresponding semiconductor devices 102a and 102b in a second direction different from the first direction. The second direction may be orthogonal to the first direction as illustrated between FIGS. 1A and 1B. The gate structure includes a gate dielectric layer 112 and a conductive gate layer 114. It should be noted that gate dielectric layer 112 represents any number of dielectric layers and similarly gate layer 114 represents any number of different conductive layers. Gate layer 114 may include any sufficiently conductive material such as a metal, metal alloy, or doped polysilicon. In some embodiments, gate layer 114 includes one or more workfunction metals around nanoribbons 106. In some embodiments, semiconductor devices 102a and 102b are p-channel devices that include a workfunction metal having titanium around its nanoribbons 106 or are n-channel devices that include a workfunction metal having tungsten around its nanoribbons 106. In some embodiments, one of semiconductor devices 102a and 102b is an n-channel device while the other one of semiconductor devices 102a and 102b is a p-channel device. Gate layer 114 may also include a fill metal or other conductive material around the workfunction metals to provide a whole gate electrode.

According to some embodiments, the gate structure is separated along the second direction by a gate cut structures 116, which act like dielectric barriers or plugs between adjacent gate structures. In an example, gate cut structures 116 effectively isolate the gate layer 114 from the conductive gate layers of any other gate structures. Gate cut structures 116 may be formed from a sufficiently insulating material, such as a dielectric material. Example materials for gate cut structures 116 include silicon nitride, silicon oxide, or silicon oxynitride.

According to some embodiments, the top portions of one or both gate cut structures 116 are angularly etched such that they include a shoulder 118 at the point where their width abruptly changes. For example, one or both of gate cut structures 116 may have a first width w1 below shoulder 118 and a second width w2 above shoulder 118, with w1 being greater than w2. The difference between w1 and w2 may be, for example, less than 10 nm, less than 5 nm, or less than 3 nm. The greater width w1 may be, for example, between about 10 nm and about 15 nm. The location of shoulder 118 may be above any of nanoribbons 106. Thus, according to some embodiments, an abrupt change to the width of one or both gate cut structures 116 occurs above any of nanoribbons 106. The transition between w1 and w2 can occur abruptly over a relatively short distance, such as less than 2 nm or less than 1 nm or less than 5 angstroms. In other examples, the transition between w1 and w2 does not need to be so abrupt. In some such examples a more gradual transition occurs between w1 and w2 with slopped sidewalls on gate cut structures 116, such as the example case where the transition occurs over a relatively longer distance such as several nanometers (e.g., 3 to 7 nm). In any case, gate cut structures 116 have the first width w1 along a first plane 119 that extends through the semiconductor region (e.g., any of nanoribbons 106) and the second width w2 along a second plane 121 parallel to the first plane and above the semiconductor region (e.g., above each of nanoribbons 106), according to some embodiments.

According to some embodiments, gate dielectric layer 112 extends along a sidewall of gate cut structure 116, but does not extend over shoulder 118. In some embodiments, gate dielectric layer 112 extends partially up the sidewall of gate cut structure 116 and stops at some distance below shoulder 118. In some other embodiments, gate dielectric layer 112 extends partially up the sidewall of gate cut structure 116 and stops at shoulder 118. In either case, gate dielectric layer 112 is not present along the sidewall of the thinner portion of gate cut structure 116 having the smaller width w2.

It should be understood that the change in width of the gate cut structures 116 yields a corresponding change in the width of the top of the gate layer 114 between gate cut structures 116. The wider top portion of gate layer 114 is beneficial for landing topside interconnect contacts on gate layer 114.

Figure 1B:
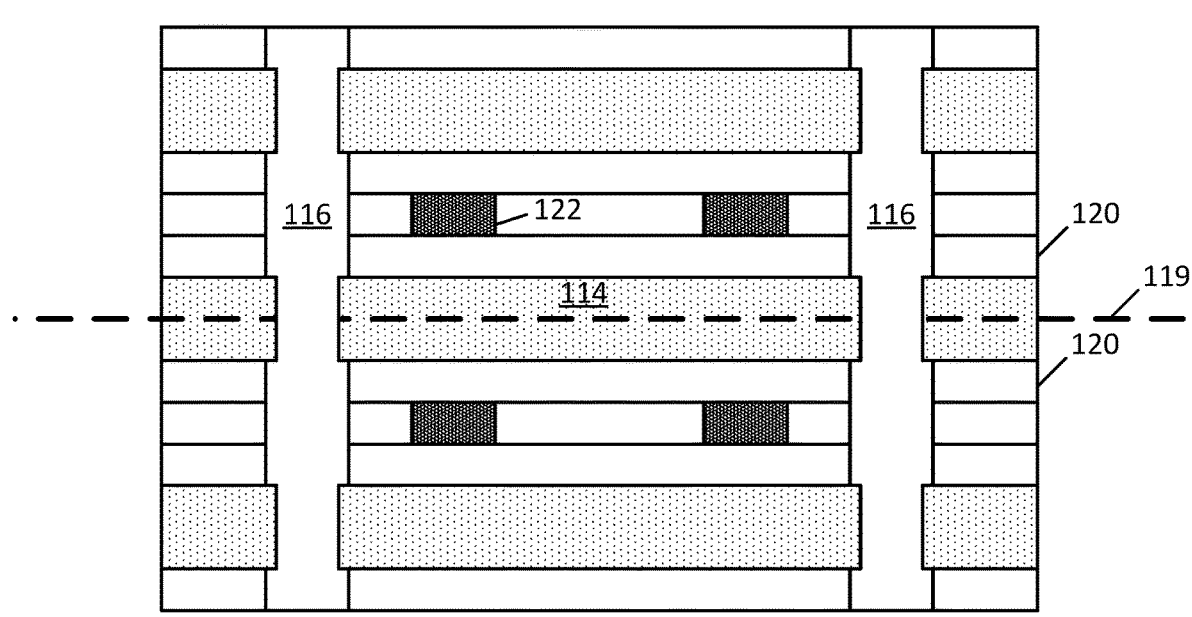

FIG. 1B illustrates a plan view of an integrated circuit that includes each of semiconductor devices 102a and 102b. The dashed line identifies a plane 119 through which the cross-section of FIG. 1A is taken. Spacer structures 120 are provided along sidewalls of the various gate structures, and may include any suitable dielectric material, such as silicon nitride or silicon oxynitride. Only gate layers 114 are shown from the gate structures for clarity. According to some embodiments, the width of gate cut structures 116 as seen from the top plan view is smaller within the gate trenches and widens back to the original width outside of the gate trenches.

The various semiconductor regions of the semiconductor devices extend between source or drain regions 122. Any of source or drain regions 122 may act as either a source region or a drain region, depending on the application and dopant profile. Any semiconductor materials suitable for source and drain regions can be used (e.g., group IV and group III-V semiconductor materials) for any of the illustrated source or drains regions 122. In any such cases, the composition and doping of source or drain regions 122 may be the same or different, depending on the polarity of the transistors. In an example, semiconductor devices 102a and 102b are p-type MOS (PMOS) transistors having a high concentration of p-type dopants in the associated source or drain regions 122, or semiconductor devices 102a and 102b are n-type MOS (NMOS) transistors having a high concentration of n-type dopants in the associated source or drain regions 122. In some examples, one of semiconductor devices 102a and 102b is an n-type transistor while the other one of semiconductor devices 102a and 102b is a p-type transistor. Any number of source and drain configurations and materials can be used.

Fabrication Methodology

FIGS. 2A-13A and 2B-13B are cross-sectional and plan views, respectively, that collectively illustrate an example process for forming an integrated circuit configured with angled gate cut structures, in accordance with an embodiment of the present disclosure. FIGS. 2A-13A represent a cross-sectional view taken across plane 119 shown in FIG. 1B, while FIGS. 2B-13B represent the corresponding plan view across a portion of the integrated circuit. Each figure shows an example structure that results from the process flow up to that point in time, so the depicted structure evolves as the process flow continues, culminating in the structure shown in FIGS. 13A and 13B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
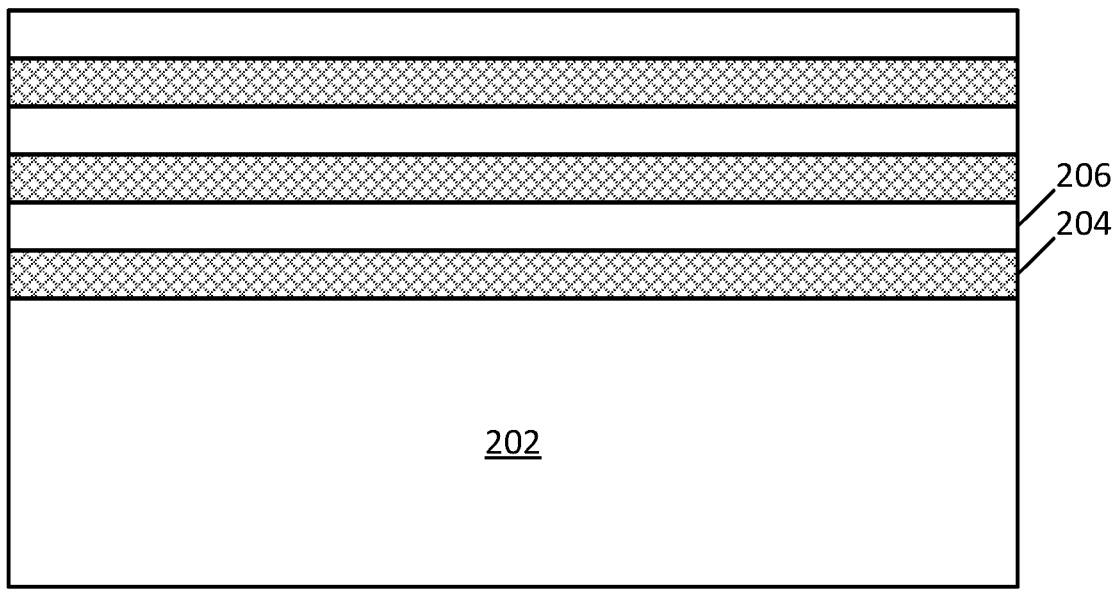
FIGS. 2A and 2B are cross-sectional and plan views, respectively, that illustrate one stage in an example process for forming an integrated circuit configured with angled gate cut structures, in accordance with an embodiment of the present disclosure.

FIG. 2A illustrates a cross-sectional view taken through a substrate 202 having a series of material layers formed over the substrate, according to an embodiment of the present disclosure. Alternating material layers may be deposited over substrate 202 including sacrificial layers 204 alternating with semiconductor layers 206. The alternating layers are used to form GAA transistor structures. Any number of alternating semiconductor layers 206 and sacrificial layers 204 may be deposited over substrate 202. The description above for substrate 104 applies equally to substrate 202.

According to some embodiments, sacrificial layers 204 have a different material composition than semiconductor layers 206. In some embodiments, sacrificial layers 204 are silicon germanium (SiGe) while semiconductor layers 206 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 204 and in semiconductor layers 206, the germanium concentration is different between sacrificial layers 204 and semiconductor layers 206. For example, sacrificial layers 204 may include a higher germanium content compared to semiconductor layers 206. In some examples, semiconductor layers 206 may be doped with either n-type dopants (to produce a p-channel transistor) or p-type dopants (to produce an n-channel transistor).

Figure 2B:
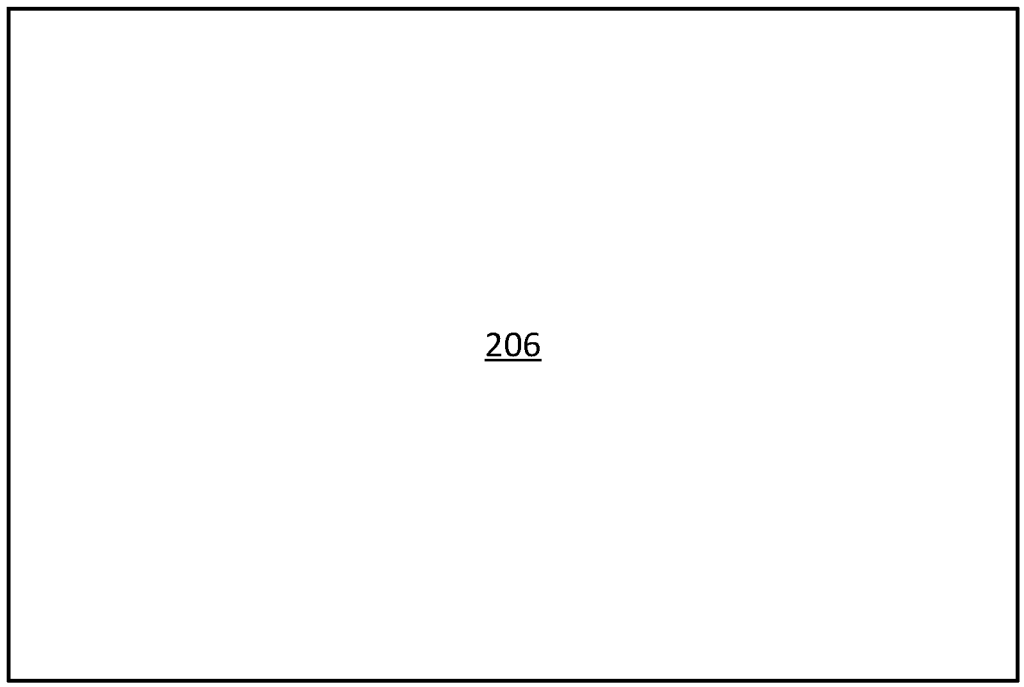

While dimensions can vary from one example embodiment to the next, the thickness of each sacrificial layer 204 may be between about 5 nm and about 20 nm. In some embodiments, the thickness of each sacrificial layer 204 is substantially the same (e.g., within 1-2 nm). The thickness of each of semiconductor layers 206 may be about the same as the thickness of each sacrificial layer 204 (e.g., about 5-20 nm). Each of sacrificial layers 204 and semiconductor layers 206 may be deposited using any known material deposition technique, such as chemical vapor deposition (CVD), plasma-enhanced chemical vapor deposition (PECVD), physical vapor deposition (PVD), or atomic layer deposition (ALD). FIG. 2B illustrates a plan view showing only the top-most deposited semiconductor layer 206, according to an embodiment. Depending on the order of the alternating layers, the topmost layer could also be a sacrificial layer 204.

Figure 3A:
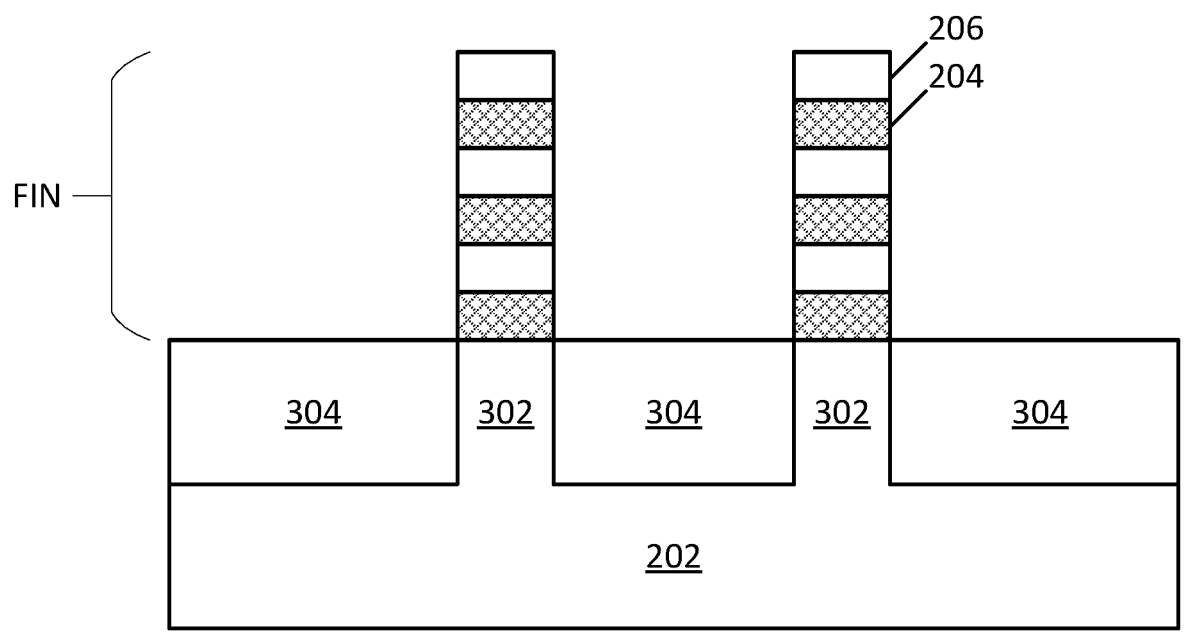
FIGS. 3A and 3B are cross-sectional and plan views, respectively, that illustrate another stage in the example process for forming an integrated circuit configured with angled gate cut structures, in accordance with an embodiment of the present disclosure.
Figure 3B:
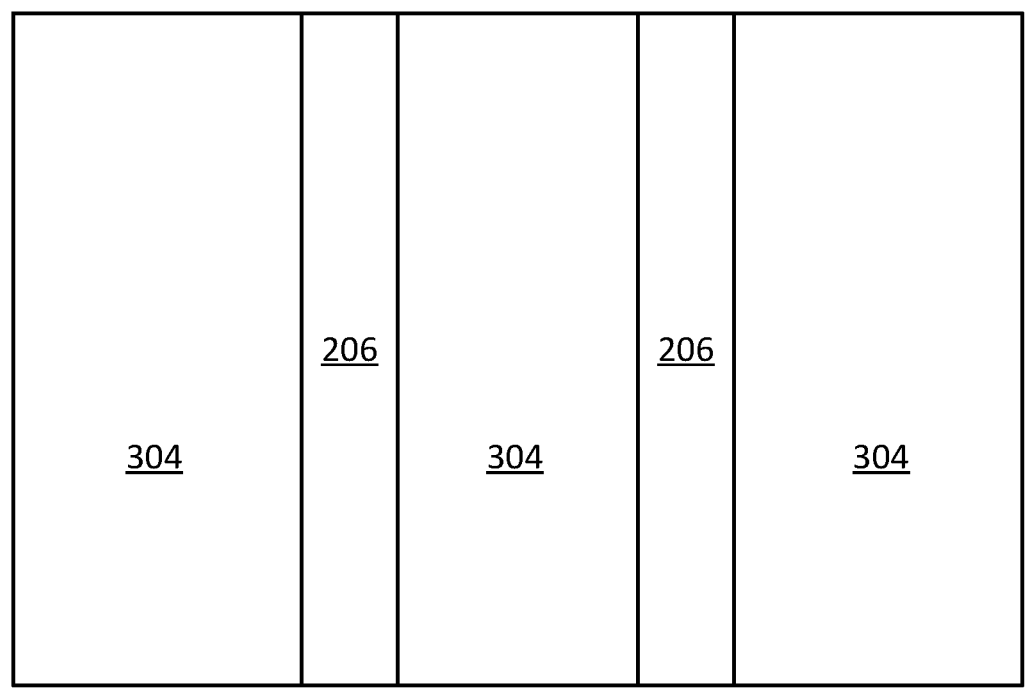

FIGS. 3A and 3B depict the cross-section and plan views of the structure shown in FIGS. 2A and 2B, respectively, following the formation of semiconductor fins, according to an embodiment. The fins may be formed via an anisotropic etching process through the alternating layer stack that continues into at least a portion of substrate 202. Since the etch extends into substrate 202, subfin regions 302 are formed beneath the alternating layer stack in each fin. The etched portion of substrate 202 may be filled with a dielectric layer 304 that acts as shallow trench isolation (STI) between adjacent fins. Dielectric layer 304 may be any suitable dielectric material such as silicon oxide. Subfin regions 302 represent remaining portions of substrate 202 between dielectric layer 304, according to some embodiments. FIG. 3B illustrates how dielectric layer 304 extends along the entire length of each of the fins, according to some embodiments.

Figure 4A:
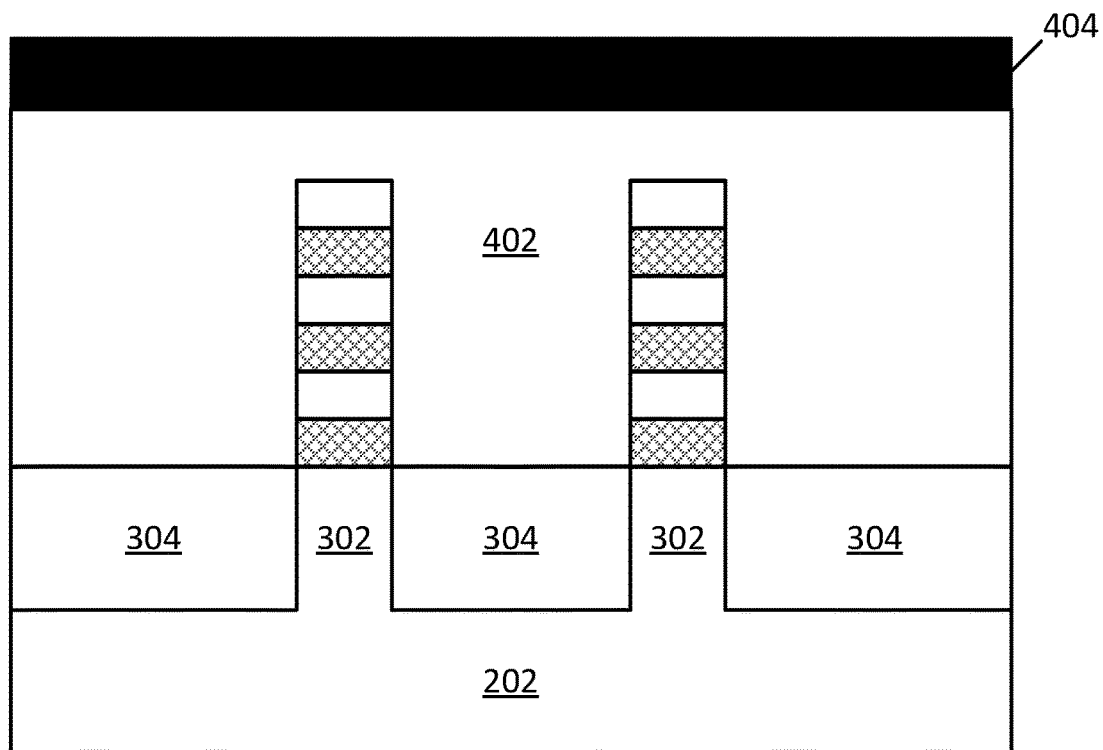
FIGS. 4A and 4B are cross-sectional and plan views, respectively, that illustrate another stage in the example process for forming an integrated circuit configured with angled gate cut structures, in accordance with an embodiment of the present disclosure.
Figure 4B:
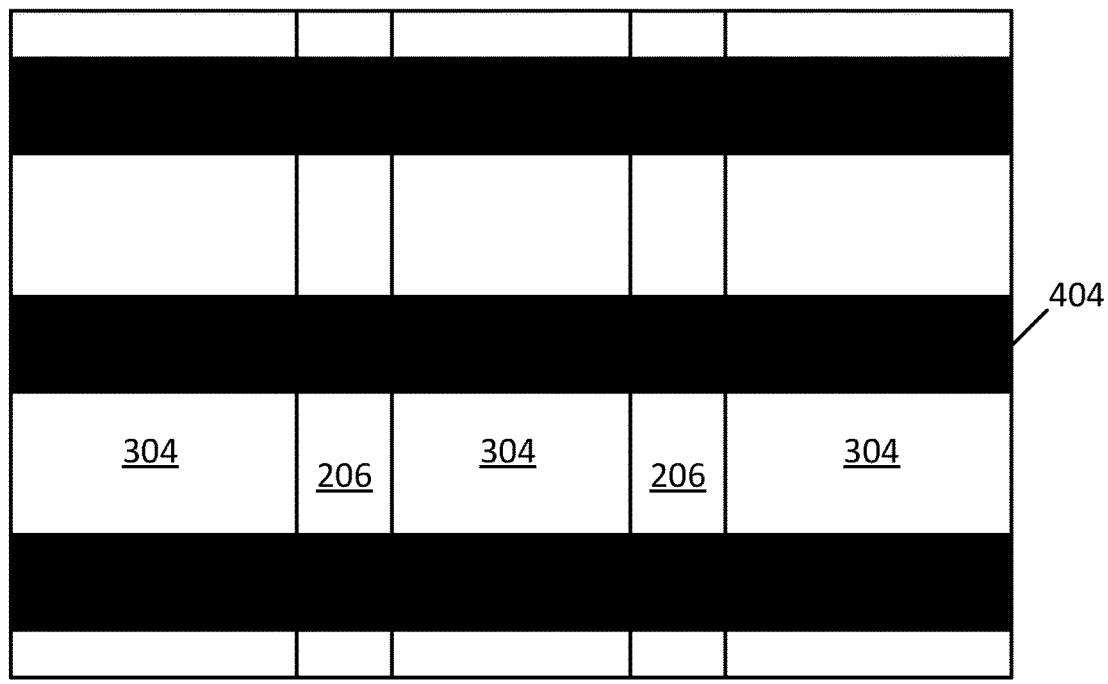

FIGS. 4A and 4B depict the cross-section and plan views of the structure shown in FIGS. 3A and 3B, respectively, following the formation of a sacrificial gate 402 beneath a corresponding gate masking layer 404, according to some embodiments. Gate masking layers 404 may be patterned in strips that extend orthogonally across each of the fins in order to form corresponding sacrificial gates 402 in strips beneath the gate masking layers 404. According to some embodiments, the sacrificial gate material is removed in all areas not protected by gate masking layers 404. Gate masking layer 404 may be any suitable hard mask material such as CHM or silicon nitride. Sacrificial gate 402 may be any suitable material that can be selectively removed without damaging the semiconductor material of the fins. In some examples, sacrificial gate 402 includes polysilicon.

Figure 5A:
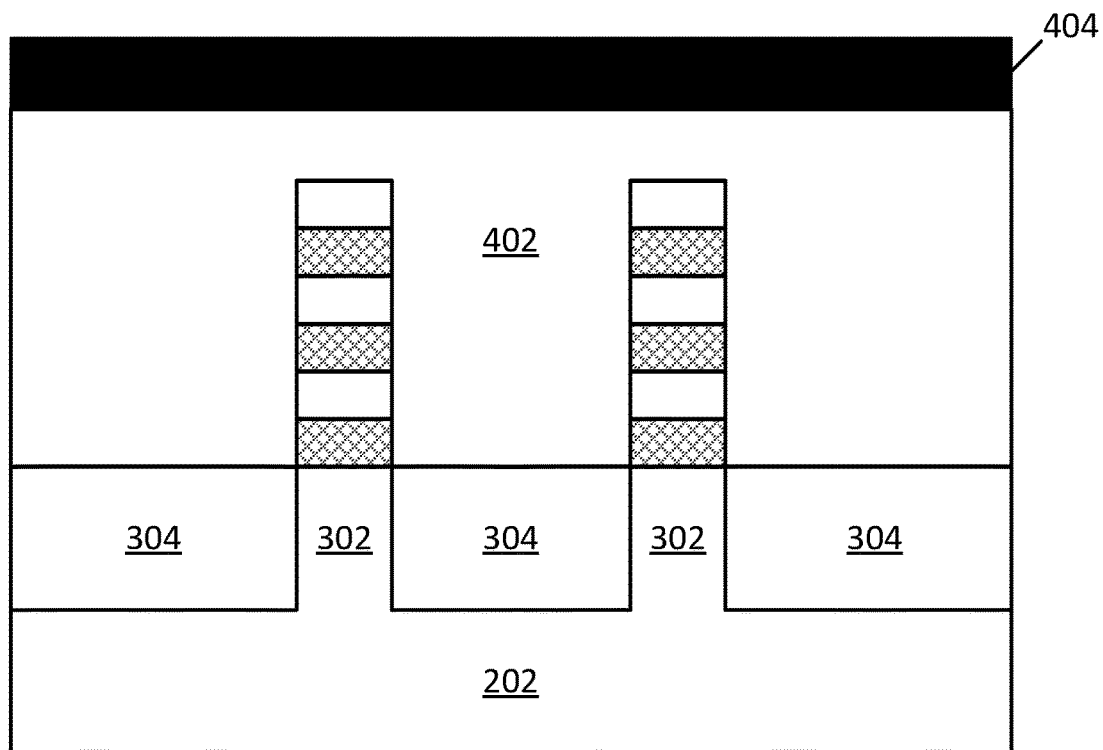
FIGS. 5A and 5B are cross-sectional and plan views, respectively, that illustrate another stage in the example process for forming an integrated circuit configured with angled gate cut structures, in accordance with an embodiment of the present disclosure.
Figure 5B:
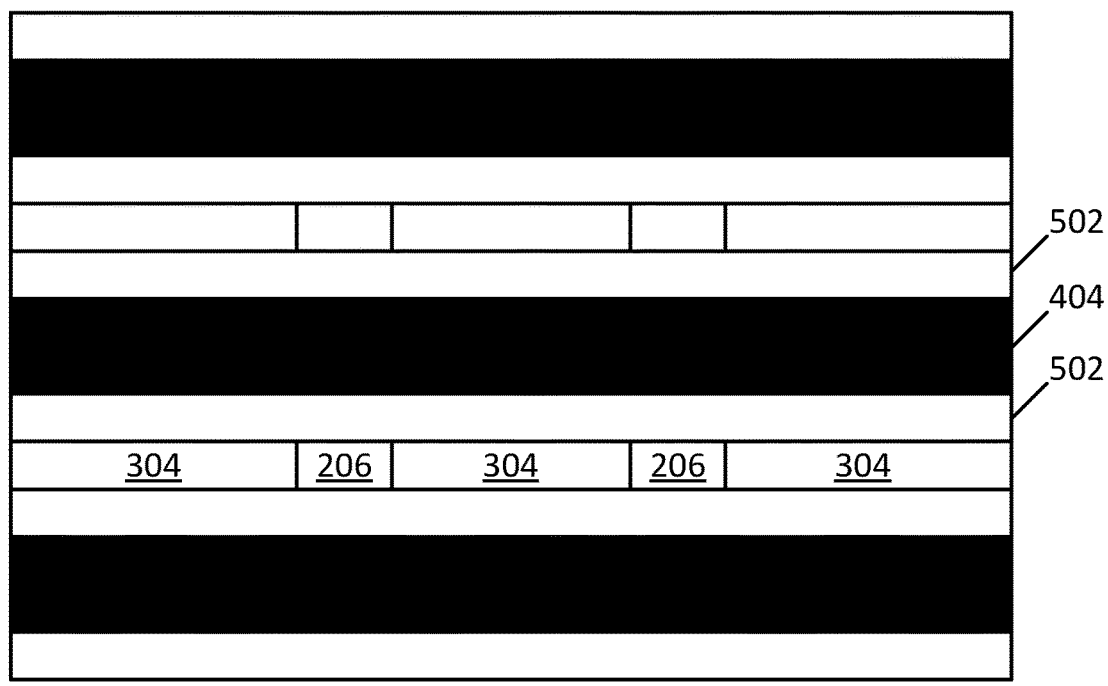

FIGS. 5A and 5B depict the cross-section and plan views of the structure shown in FIGS. 4A and 4B, respectively, following the formation of spacer structures 502, according to some embodiments. Spacer structures 502 may be formed along the sidewalls of both sacrificial gates 402 and gate masking layers 404. In some other embodiments, spacer structures 502 are formed along the sidewalls of sacrificial gates 402 following the removal of gate masking layers 404. Spacer structures 502 may be deposited and then etched back such that spacer structures 502 remain mostly only on sidewalls of any exposed structures. In the plan view of FIG. 5B, spacer structures 502 may also be formed along sidewalls of the exposed fins (having a top semiconductor layer 206) over dielectric layer 304. Such sidewall spacers on the fins can be removed during later processing when forming the source or drain regions. According to some embodiments, spacer structures 502 may be any suitable dielectric material, such as silicon nitride, silicon carbon nitride, or silicon oxycarbonitride. In one such embodiment, spacer structures 502 comprise a nitride and dielectric layer 304 comprises an oxide, so as to provide a degree of etch selectivity during final gate processing. Other etch selective dielectric schemes (e.g., oxide/carbide, carbide/nitride) can be used as well for spacer structures 502 and dielectric layer 304. In other embodiments, spacer structures 502 and dielectric layer 304 are compositionally the same or otherwise similar, where etch selectivity is not employed.

Figure 6A:
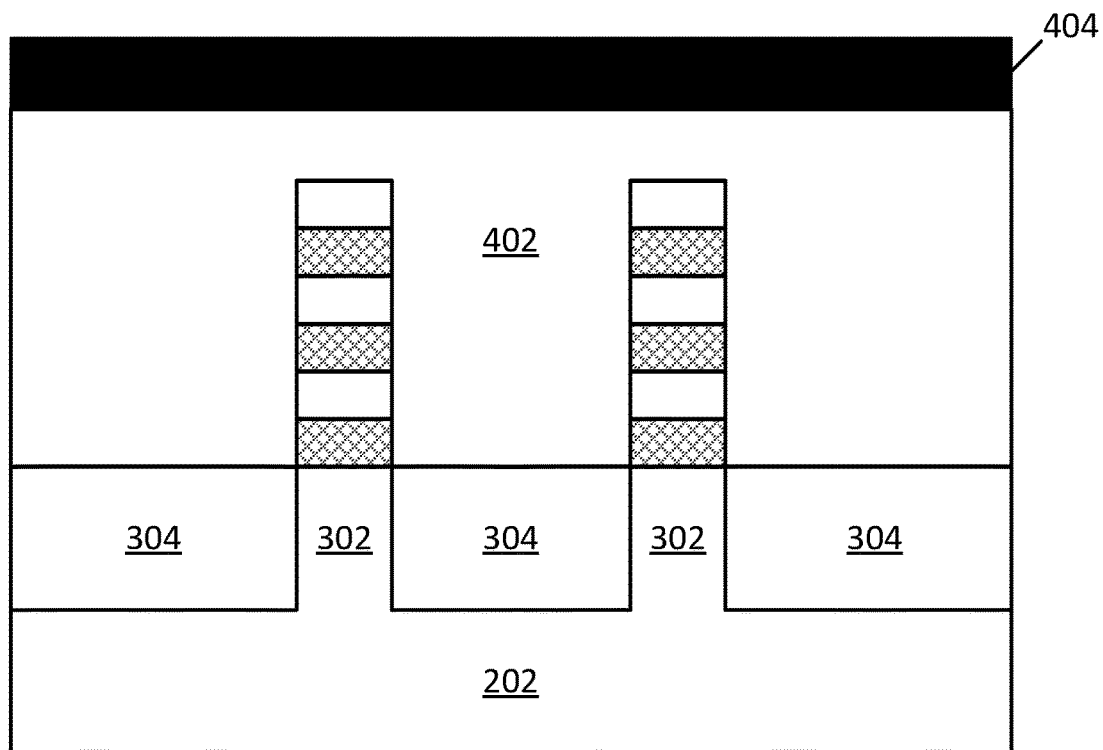
FIGS. 6A and 6B are cross-sectional and plan views, respectively, that illustrate another stage in the example process for forming an integrated circuit configured with angled gate cut structures, in accordance with an embodiment of the present disclosure.
Figure 6B:

FIGS. 6A and 6B depict the cross-section and plan views of the structure shown in FIGS. 5A and 5B, respectively, following the formation of source or drain regions 602, according to some embodiments. In more detail, and according to an example, exposed portions of the fins between spacer structures 502 are removed. The exposed fin portions may be removed using any anisotropic etching process, such as reactive ion etching (RIE). Once the exposed fins have been removed, source or drain regions 602 may be formed in the areas that had been previously occupied by the exposed fins between spacer structures 502. According to some embodiments, source or drain regions 602 are epitaxially grown from the exposed semiconductor material of the fins (or nanoribbons, nanowires or nanosheets, as the case may be) along the exterior walls of spacer structures 502. In some example embodiments, source or drain regions 602 are NMOS source or drain regions (e.g., epitaxial silicon) or PMOS source or drain regions (e.g., epitaxial SiGe).

According to some embodiments, a dielectric fill 604 is provided between adjacent source or drain regions 602. Dielectric fill 604 may be any suitable dielectric material, such as silicon oxide. In some examples, dielectric fill 604 also extends over a top surface of source or drain regions 602 (e.g., up to and planar with a top surface of spacer structures 502). One or more conductive contacts may be formed at a later time through dielectric fill 604 to provide electrical contact to source or drain regions 602. For the remaining figures, dielectric fill 604 is only illustrated adjacent to source or drain regions 602 so that they are visible in the plan view.

Figure 7A:
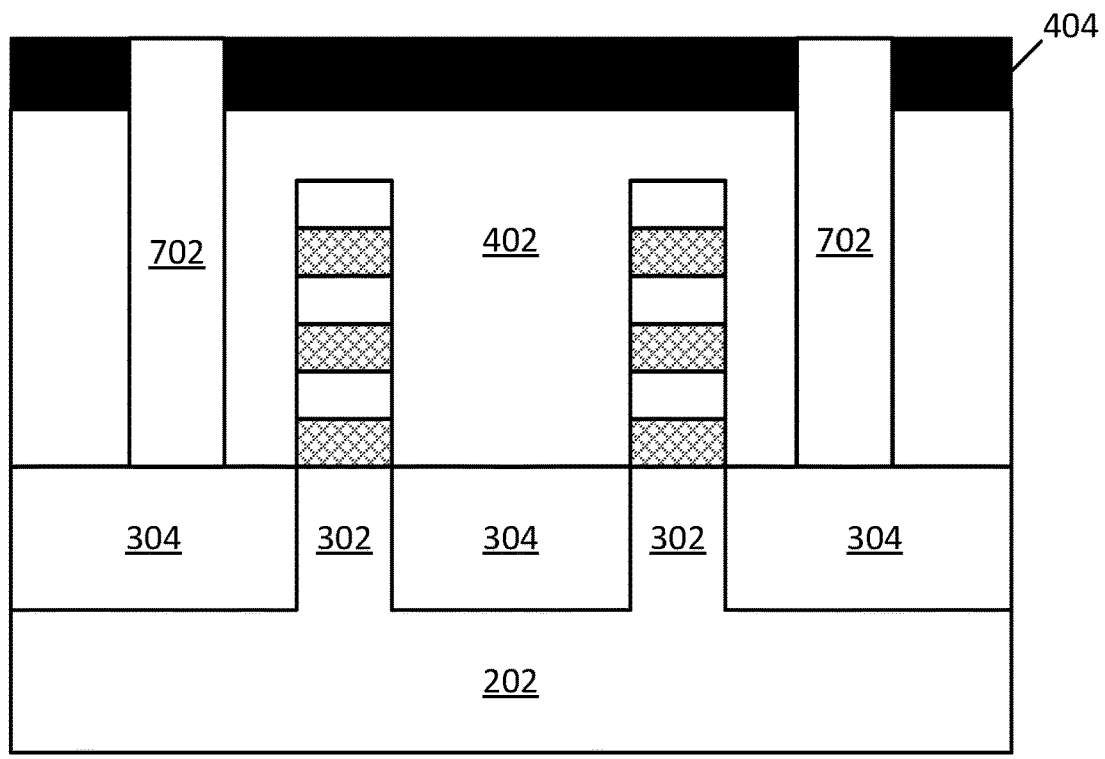
FIGS. 7A and 7B are cross-sectional and plan views, respectively, that illustrate another stage in the example process for forming an integrated circuit configured with angled gate cut structures, in accordance with an embodiment of the present disclosure.
Figure 7B:
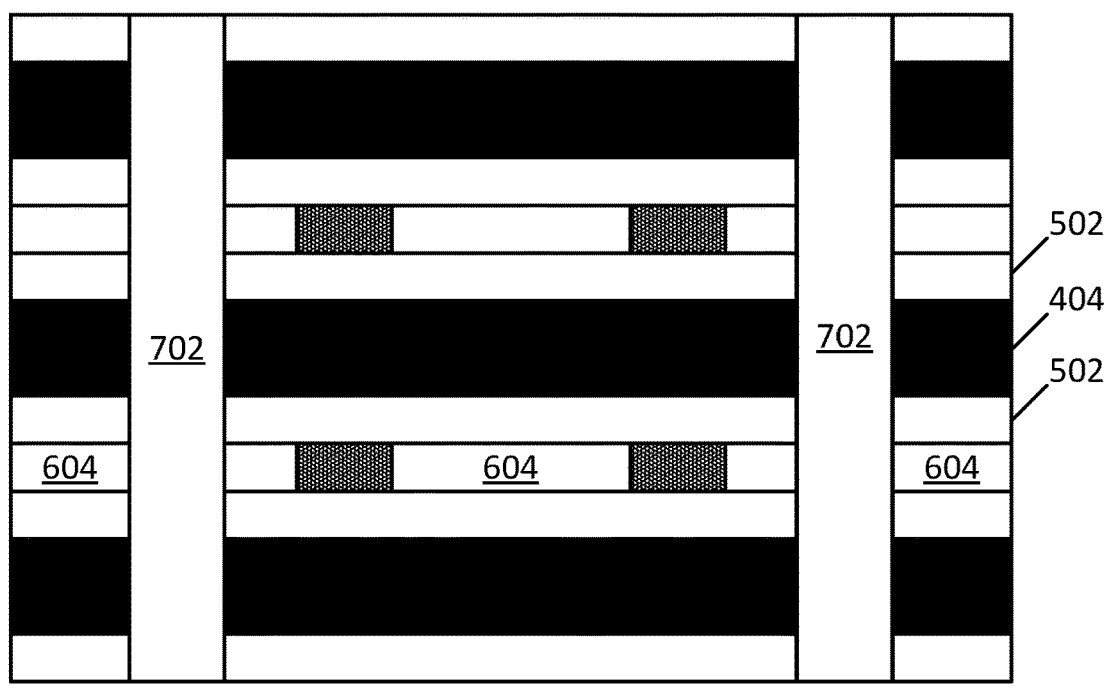

FIGS. 7A and 7B depict the cross-section and plan views of the structure shown in FIGS. 6A and 6B, respectively, following the formation of gate cut structures 702, according to some embodiments. Gate cut structures 702 may extend through an entire thickness of sacrificial gate 402 (and gate masking layer 404, if present). An anisotropic etching process may be performed to etch a recess through sacrificial gate 402 until a top surface of dielectric layer 304 is reached. In some embodiments, the anisotropic etch also removes a portion of the thickness of dielectric layer 304. Gate cut structures 702 may be formed within the etched recesses by depositing any number of dielectric materials. In some examples, gate cut structures 702 include silicon oxide, silicon nitride, or silicon oxynitride. Other low-K dielectric materials may be used as well. Any excess dielectric material deposited outside of the recesses may be polished away using, for example, chemical mechanical polishing (CMP).

As seen in FIG. 7B, gate cut structures 702 may be formed as continuous structures that extend through multiple sacrificial gate layers 402 and their corresponding spacer structures 502. Accordingly, gate cut structures 702 may also be formed through dielectric fill 604 within the source/drain trench. In some other embodiments, gate cut structures 702 are formed as separate structures through each sacrificial gate 402. Gate cut structures 702 may be formed to run parallel with the fins (or orthogonal to sacrificial gates 402).

Gate cut structures 702 may be arranged adjacent to any given semiconductor device in the integrated circuit. In the illustrated example, two gate cut structures 702 are arranged adjacent to two different semiconductor devices, leaving a portion of sacrificial gate 402 extending between the two gate cut structures 702 in the second direction and over the fins of the two different semiconductor devices.

Figure 8A:
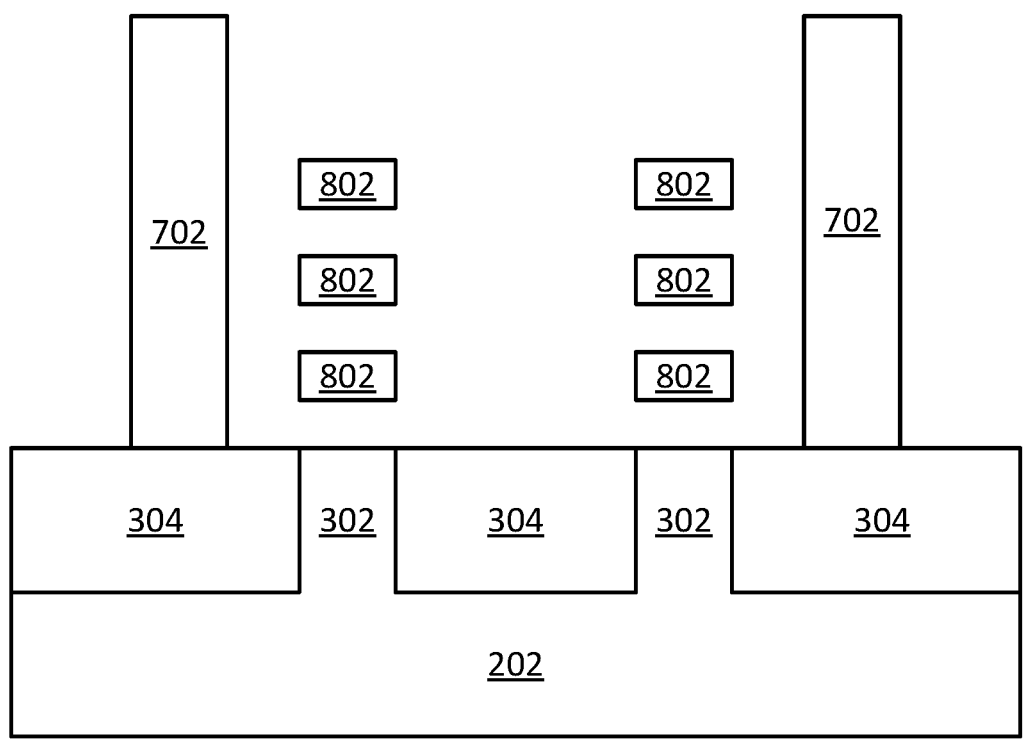
FIGS. 8A and 8B are cross-sectional and plan views, respectively, that illustrate another stage in the example process for forming an integrated circuit configured with angled gate cut structures, in accordance with an embodiment of the present disclosure.
Figure 8B:
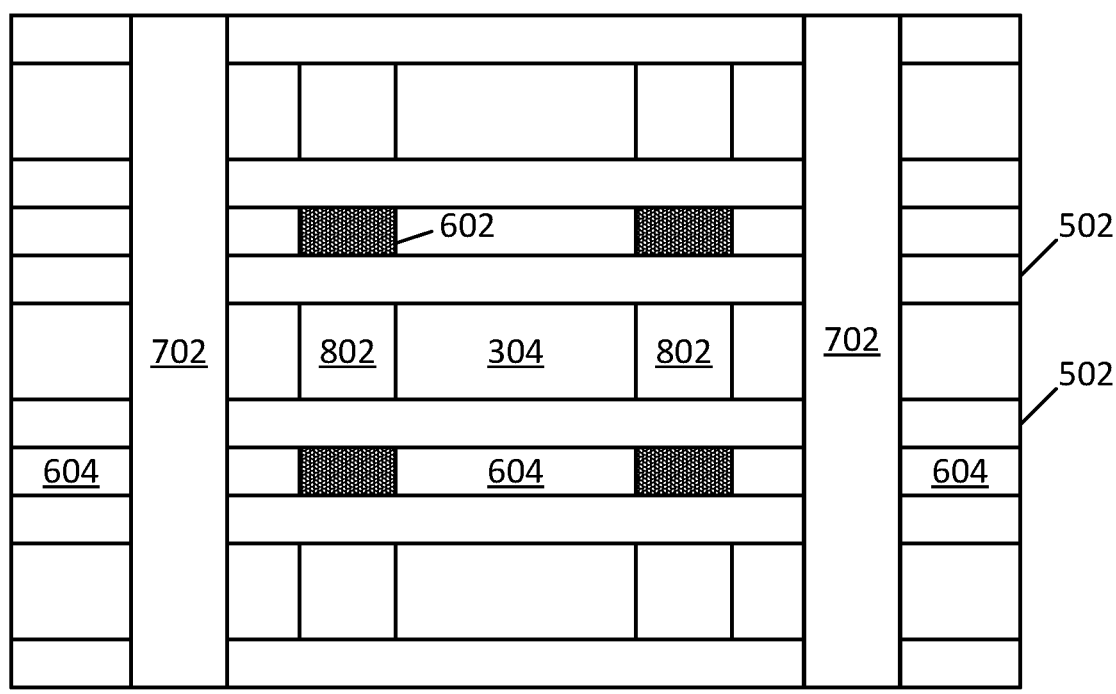

FIGS. 8A and 8B depict the cross-section and plan views of the structure shown in FIGS. 7A and 7B, respectively, following the removal of sacrificial gates 402 and sacrificial layers 204, according to some embodiments. In examples where gate masking layers 404 are still present, they would be removed at this time. Once sacrificial gates 402 are removed, the fins extending between spacer structures 502 are exposed.

In the example where the fins include alternating semiconductor layers, sacrificial layers 204 are selectively removed to leave behind nanoribbons 802 that extend between corresponding source or drain regions 602. Each vertical set of nanoribbons 802 represents the semiconductor region of a different semiconductor device. It should be understood that nanoribbons 802 may also be nanowires or nanosheets. Gate cut structures 702 remain adjacent to corresponding semiconductor device following the removal of sacrificial gates 402. Sacrificial gates 402 and sacrificial layers 204 may be removed using the same isotropic etching process or different isotropic etching processes.

Figure 9A:
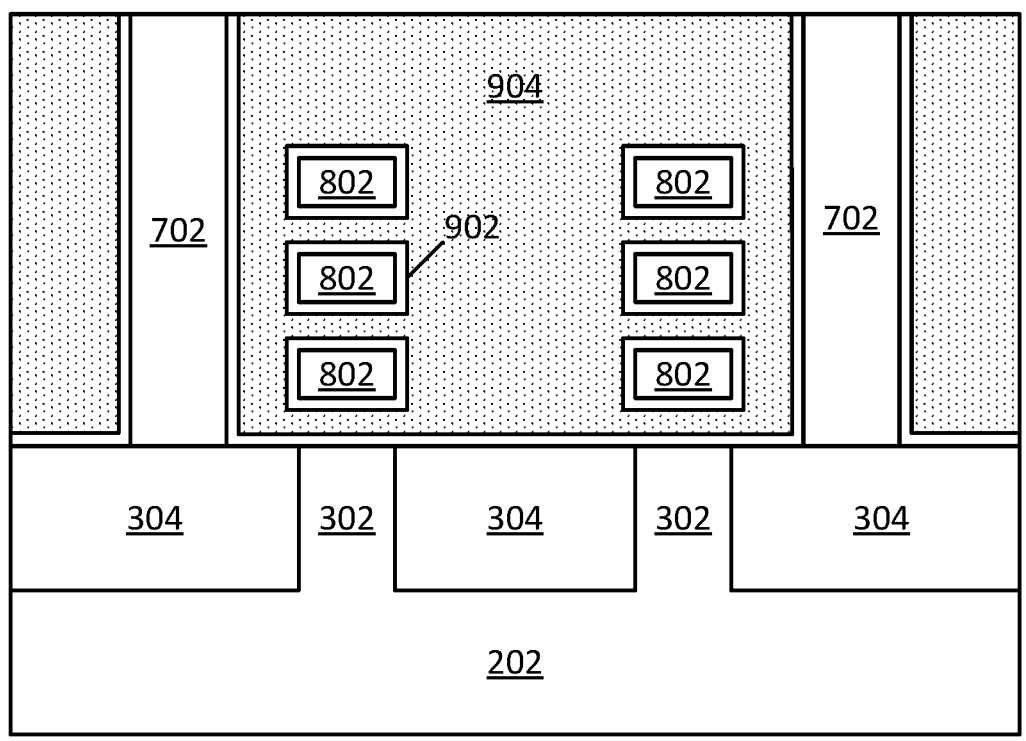
FIGS. 9A and 9B are cross-sectional and plan views, respectively, that illustrate another stage in the example process for forming an integrated circuit configured with angled gate cut structures, in accordance with an embodiment of the present disclosure.
Figure 9B:
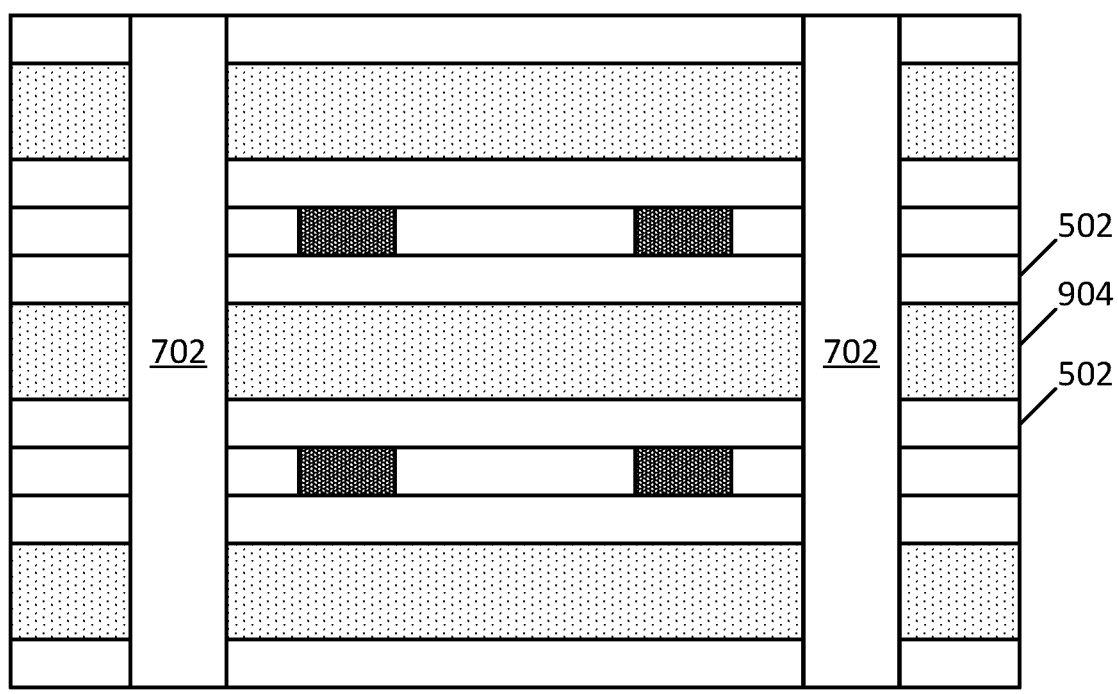

FIGS. 9A and 9B depict the cross-section and plan views of the structure shown in FIGS. 8A and 8B, respectively, following the formation of gate structures that include a gate dielectric 902 and a conductive gate layer 904, according to some embodiments. Gate dielectric 902 may be first formed around nanoribbons 802 prior to the formation of gate layer 904. The gate dielectric 902 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 902 includes a layer of hafnium oxide with a thickness between about 1 nm and about 5 nm. In some embodiments, gate dielectric 902 may include one or more silicates (e.g., titanium silicate, tungsten silicate, niobium silicate, and silicates of other transition metals). In some cases, gate dielectric 902 may include a first layer on nanoribbons 802, and a second layer on the first layer. The first layer can be, for instance, an oxide of the semiconductor material of nanoribbons 802 (e.g., silicon dioxide) and the second layer can be a high-k dielectric material (e.g., hafnium oxide). According to some embodiments, gate dielectric 902 forms along all surfaces exposed within the gate trench between spacer structures 502, such as on the top surfaces of dielectric layer 304 and subfin regions 302, and along inner sidewalls of spacer structures 502 (including along sides of gate cut structures 702). Accordingly, one sidewall of a given gate cut structure 702 can contact a first gate dielectric from a first gate structure and the opposite sidewall of the given gate cut structure 702 can contact a second gate dielectric from a second gate structure adjacent to the first gate structure along the second direction. Further note that such a configuration indicates that the gate structures are formed after gate cut structures 702.

Gate layer 904 may be deposited using electroplating, electroless plating, CVD, PECVD, ALD, or PVD, to name a few examples. In some embodiments, gate layer 904 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate layer 904 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

According to some embodiments, each gate structure is formed over the semiconductor regions of one or more semiconductor devices. In some embodiments, a given gate structure is constrained over the semiconductor regions of one or more semiconductor devices in the second direction by adjacent gate cut structures 702. Following the formation of the gate structures, the entire structure may be polished such that the top surfaces of the gate structures are planar with the top surface of at least spacer structures 502.

Figure 10A:
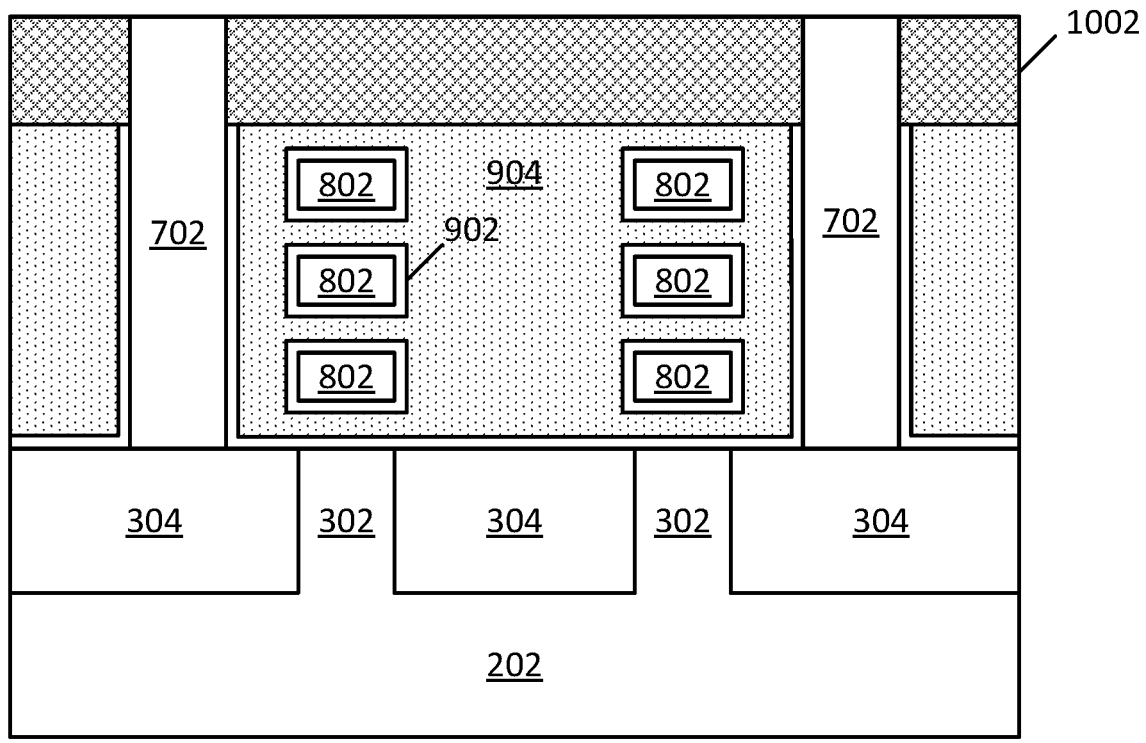
FIGS. 10A and 10B are cross-sectional and plan views, respectively, that illustrate another stage in the example process for forming an integrated circuit configured with angled gate cut structures, in accordance with an embodiment of the present disclosure.
Figure 10B:
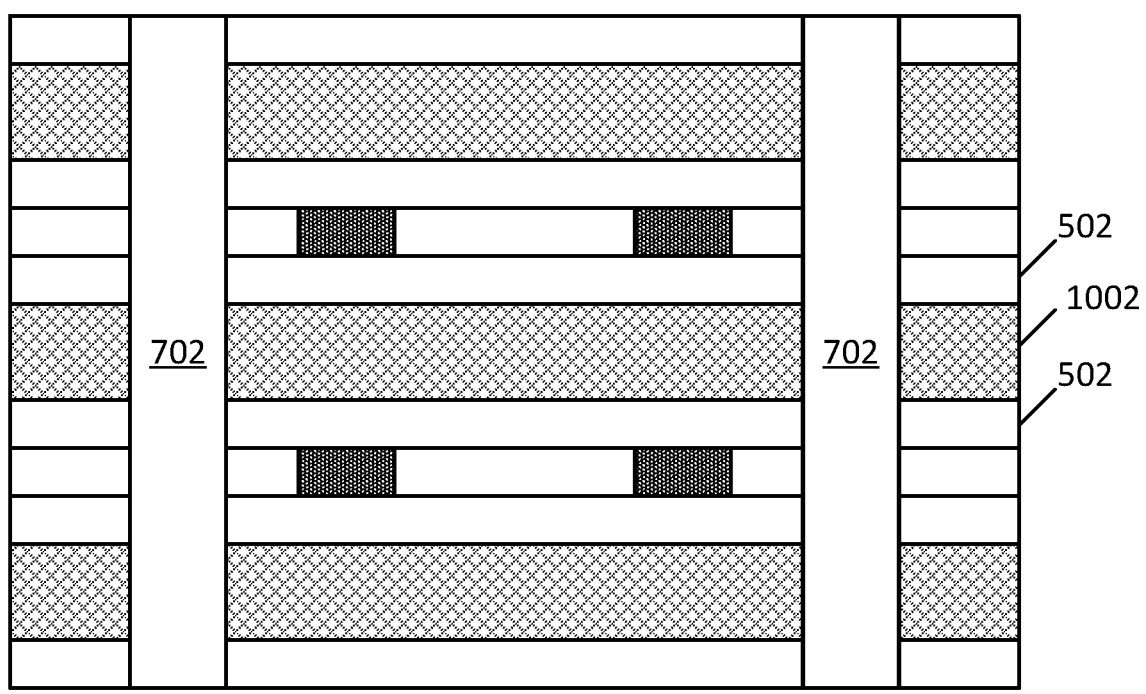

FIGS. 10A and 10B depict the cross-section and plan views of the structure shown in FIGS. 9A and 9B, respectively, following the formation of a sacrificial material 1002, according to some embodiments. A top portion of gate layer 904 is first recessed to expose top sections of gate cut structures 702. In some embodiments, gate layer 904 is recessed between about 10 nm and about 20 nm, or recessed up to 30 nm. In some embodiments, gate layer 904 is recessed to any depth so long as the top surface of nanoribbons 802 are not exposed. Gate layer 904 may be removed using an isotropic etching process that selectively removes the conductive material of gate layer 904. According to some embodiments, any exposed portions of gate dielectric 902 along the sidewalls of gate cut structures 702 are also removed using, for example, an isotropic etching process. In this way, gate dielectric 902 may extend along the sidewalls of gate cut structures 702 only as high as the top surface of gate layer 904 following the recessing.

Once the recess has been made, sacrificial material 1002 may be formed within the recess over gate layer 904 and between gate cut structures 702. In some embodiments, sacrificial material 1002 is any suitable material that can be easily removed at a later time without damaging other surrounding structures. In one example, sacrificial material 1002 is a carbon hard mask (CHM). According to some embodiments, sacrificial material 1002 is only formed within the gate trenches as seen in FIG. 10B.

Figure 11A:
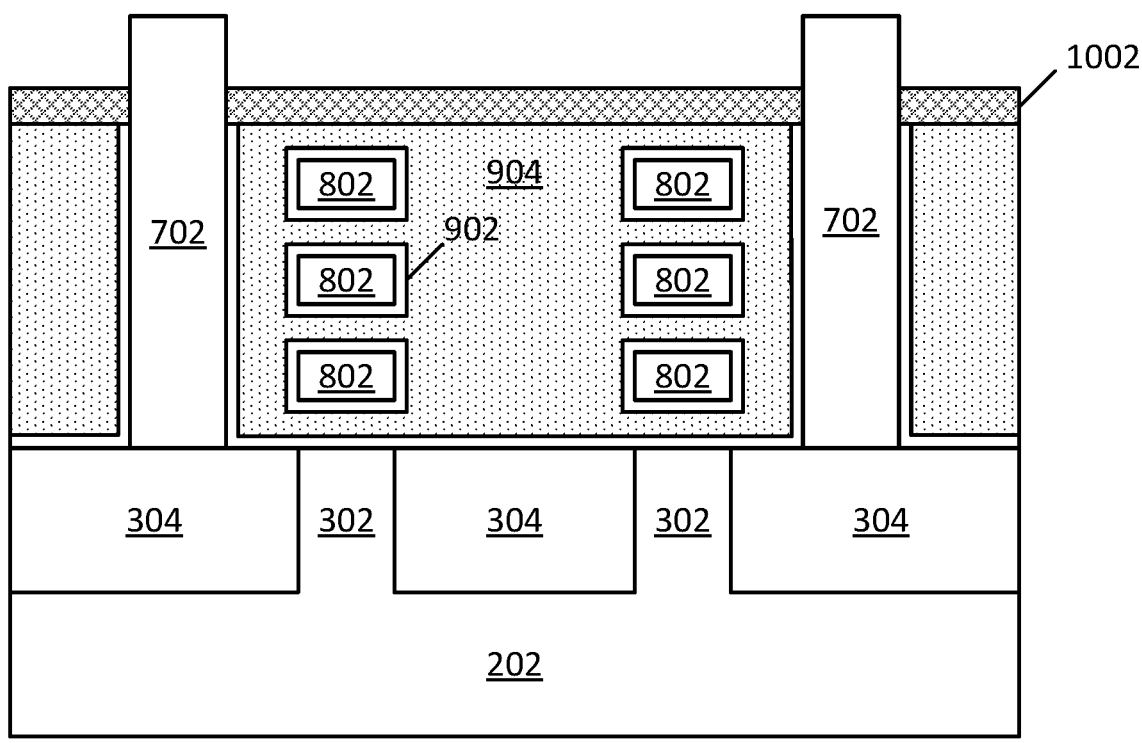
FIGS. 11A and 11B are cross-sectional and plan views, respectively, that illustrate another stage in the example process for forming an integrated circuit configured with angled gate cut structures, in accordance with an embodiment of the present disclosure.
Figure 11B:
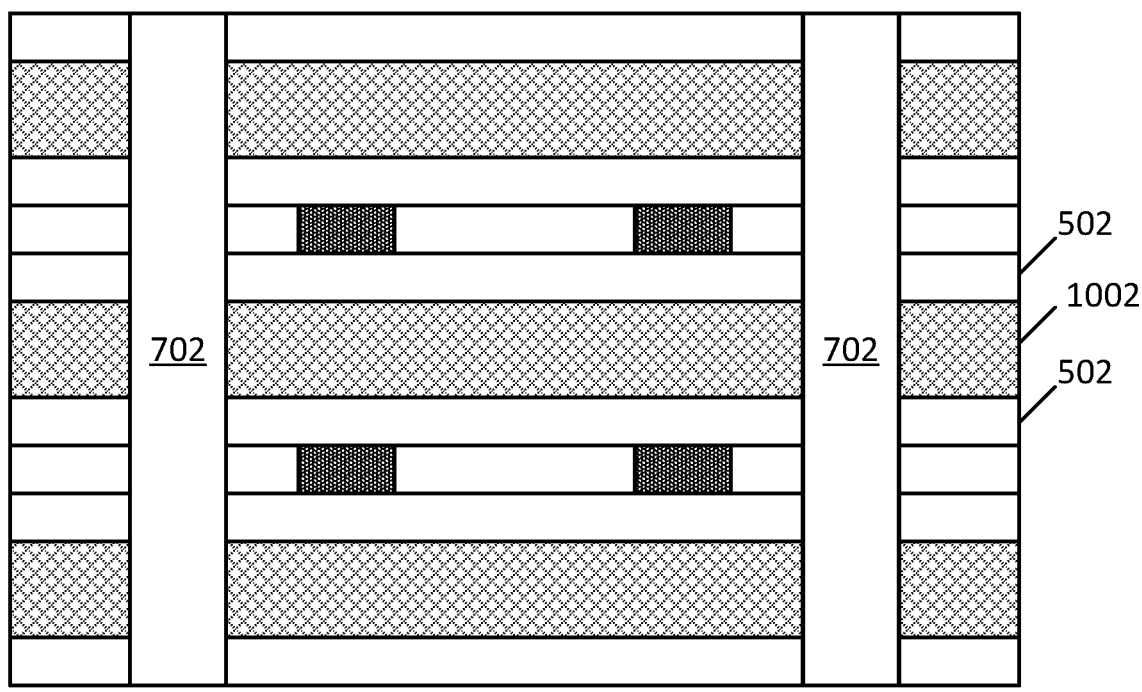

FIGS. 11A and 11B depict the cross-section and plan views of the structure shown in FIGS. 10A and 10B, respectively, following the recessing of sacrificial material 1002, according to some embodiments. Sacrificial material 1002 may be recessed by any amount so long as some of it still remains to cover the top surface of gate layer 904. Recessing sacrificial material 1002 exposes top portions of gate cut structures 702 extending above a top surface of sacrificial material 1002.

Figure 12A:
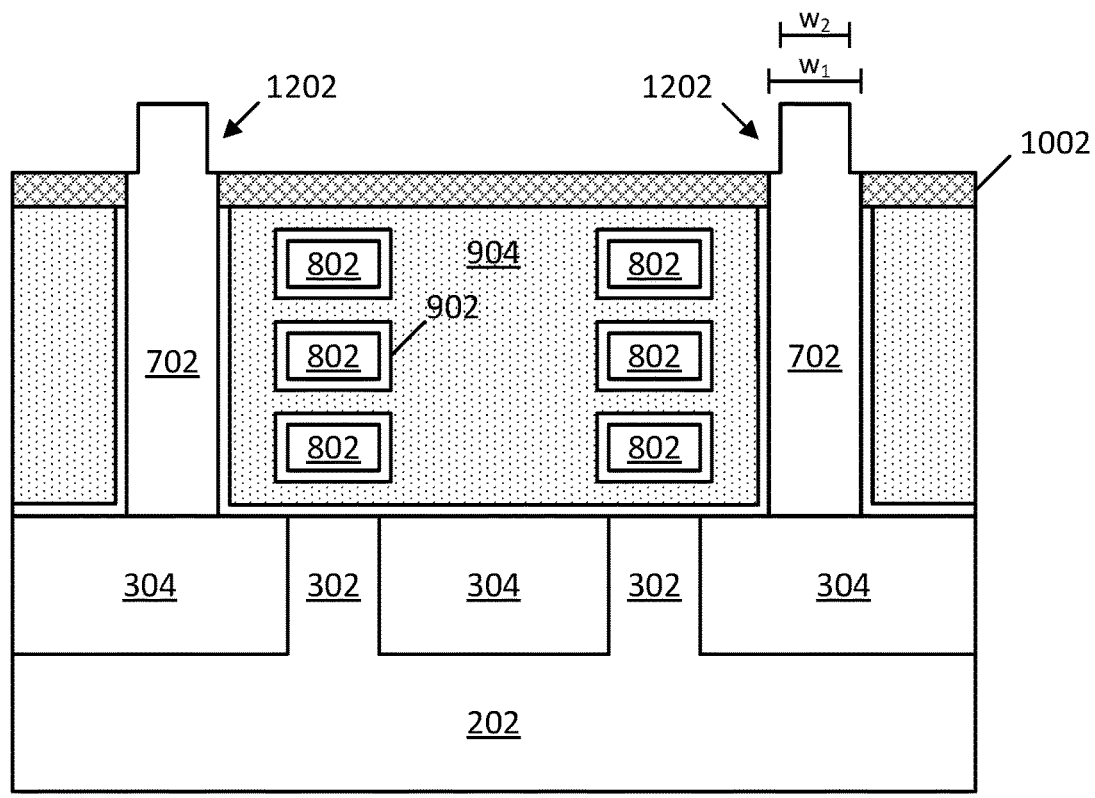
FIGS. 12A and 12B are cross-sectional and plan views, respectively, that illustrate another stage in the example process for forming an integrated circuit configured with angled gate cut structures, in accordance with an embodiment of the present disclosure.
Figure 12B:
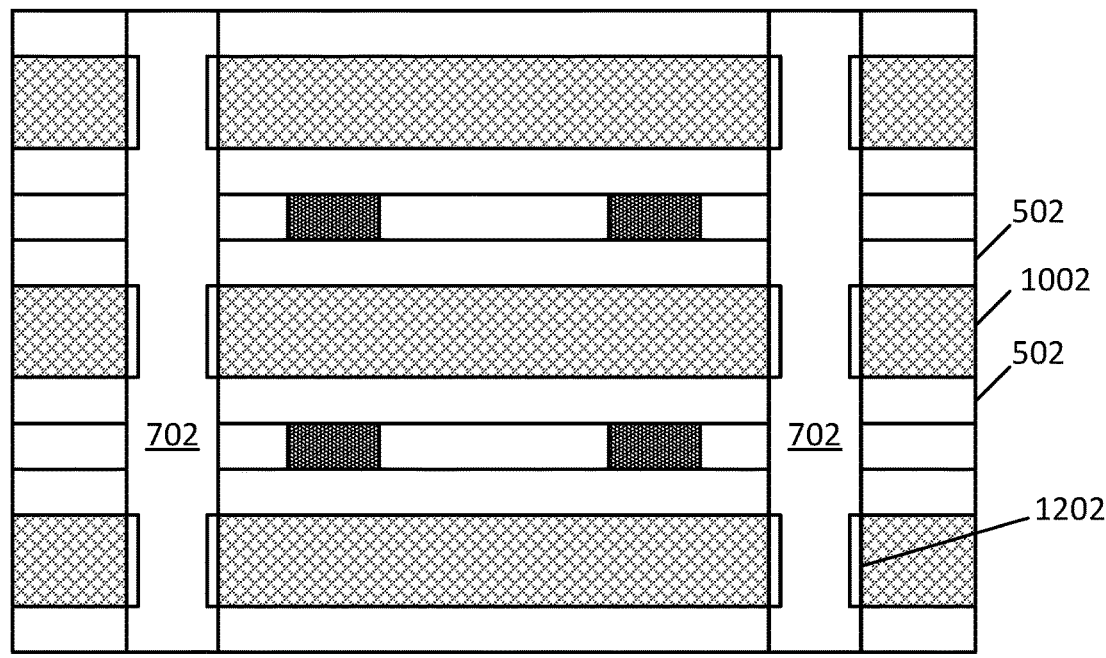

FIGS. 12A and 12B depict the cross-section and plan views of the structure shown in FIGS. 11A and 11B, respectively, following a lateral etch of the exposed top portions of gate cut structures 702, according to some embodiments. An angled anisotropic etch may be performed to preferentially remove material from the sides of the exposed portions of gate cut structures 702. This type of angled etch may result in a shoulder or step-like feature 1202 marking an abrupt change in the width of gate cut structures 702 (e.g., a transition between a first width w1 and a second width w2). Recall the transition can occur instantly in a pure step or an otherwise short distance, as previously explained. According to some embodiments, shoulder 1202 may be located at substantially the same level as the top surface of sacrificial material 1002.

Figure 12C:
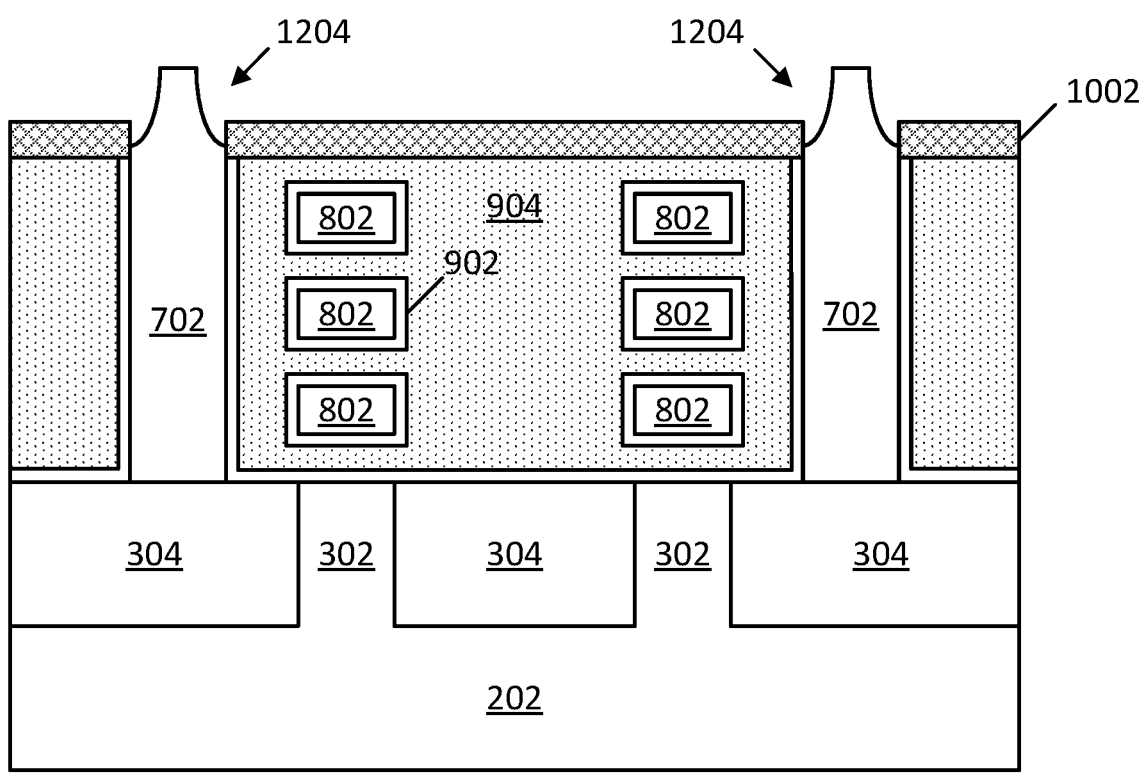
FIG. 12C illustrates the cross-section view of FIG. 12A using a different etch technique to form the angled gate cut structures, in accordance with an embodiment of the present disclosure.

Different etching techniques may be used to perform the lateral etching of gate cut structures 702, and depending on the technique used, the profile can look different. FIG. 12C illustrates another cross-section of the structure shown in FIG. 10A following a lateral etch using an isotropic etching technique. In this example, the isotropic etch removes the exposed portions of gate cut structures 702 from all sides equally, yielding a more sloped etch profile the gradually reduces the width of gate cut structures 702. Accordingly, the isotropic etch may form dimples 1204 at the top portions of gate cut structures 702. Any suitable etching technique that reduces the width of the exposed portions of gate cut structures 702 can be used.

Figure 13A:
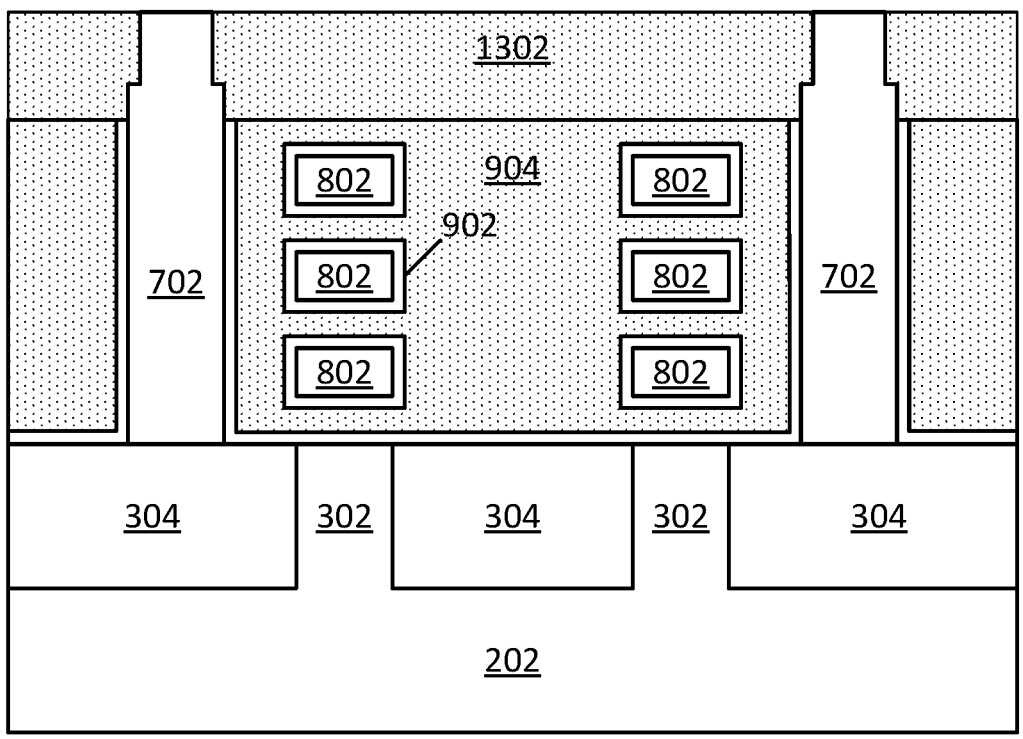
FIGS. 13A and 13B are cross-sectional and plan views, respectively, that illustrate another stage in the example process for forming an integrated circuit configured with angled gate cut structures, in accordance with an embodiment of the present disclosure.
Figure 13B:
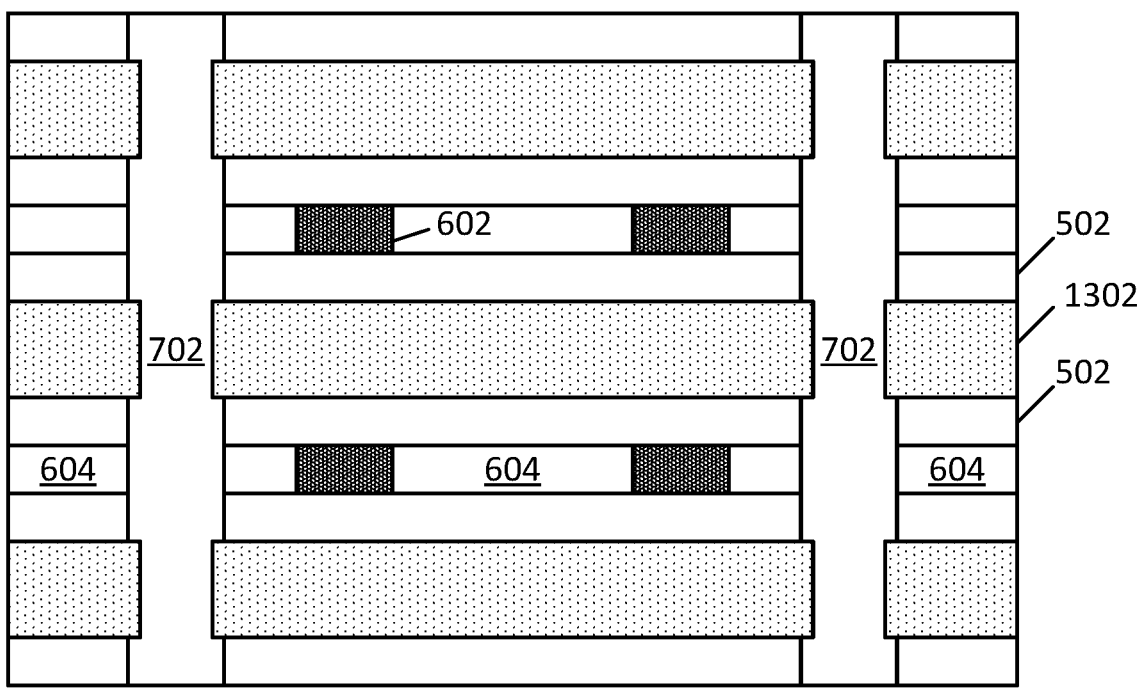

FIGS. 13A and 13B depict the cross-section and plan views of the structure shown in FIGS. 12A and 12B, respectively, following the removal of sacrificial material 1002 and formation of an additional conductive layer 1302 over gate layer 904, according to some embodiments. Conductive layer 1302 spans the width between gate cut structures 702 with the gate trench and has a wider top portion due to the corresponding narrower width of the top portions of gate cut structures 702.

According to some embodiments, conductive layer 1302 has the same material composition as gate layer 904 (or at least a fill metal portion of gate layer 904), such that conductive layer 1302 and gate layer 904 can collectively act as a single gate electrode for the gate structure. In some embodiments, no seam is observable between conductive layer 1302 and gate layer 904, while in other embodiments a seam is visible. The seam may be visible in situations where different conductive materials or deposition processes are used for conductive layer 1302 and gate layer 904. In some embodiments, gate layer 904 is considered to incorporate conductive layer 1302 (such that the combined structure may be identified as the gate layer).

Figure 14:
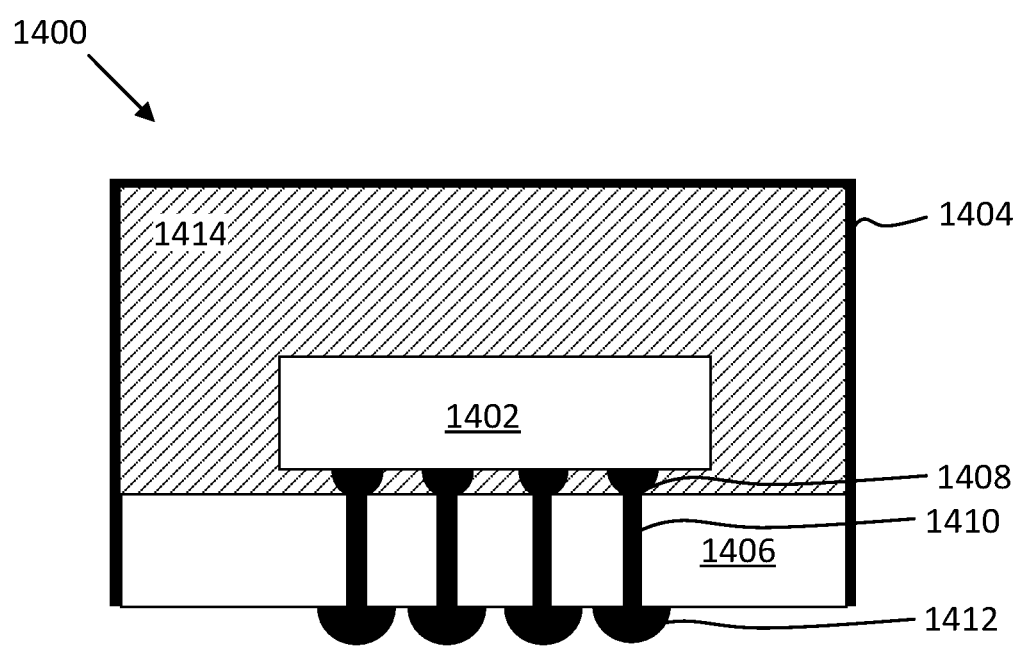
FIG. 14 illustrates a cross-section view of a chip package containing one or more semiconductor dies, in accordance with some embodiments of the present disclosure.

FIG. 14 illustrates an example embodiment of a chip package 1400, in accordance with an embodiment of the present disclosure. As can be seen, chip package 1400 includes one or more dies 1402. One or more dies 1402 may include at least one integrated circuit having semiconductor devices, such as any of the semiconductor devices disclosed herein. One or more dies 1402 may include any other circuitry used to interface with other devices formed on the dies, or other devices connected to chip package 1400, in some example configurations.

As can be further seen, chip package 1400 includes a housing 1404 that is bonded to a package substrate 1406. The housing 1404 may be any standard or proprietary housing, and may provide, for example, electromagnetic shielding and environmental protection for the components of chip package 1400. The one or more dies 1402 may be conductively coupled to a package substrate 1406 using connections 1408, which may be implemented with any number of standard or proprietary connection mechanisms, such as solder bumps, ball grid array (BGA), pins, or wire bonds, to name a few examples. Package substrate 1406 may be any standard or proprietary package substrate, but in some cases includes a dielectric material having conductive pathways (e.g., including conductive vias and lines) extending through the dielectric material between the faces of package substrate 1406, or between different locations on each face. In some embodiments, package substrate 1406 may have a thickness less than 1 millimeter (e.g., between 0.1 millimeters and 0.5 millimeters), although any number of package geometries can be used. Additional conductive contacts 1412 may be disposed at an opposite face of package substrate 1406 for conductively contacting, for instance, a printed circuit board (PCB). One or more vias 1410 extend through a thickness of package substrate 1406 to provide conductive pathways between one or more of connections 1408 to one or more of contacts 1412. Vias 1410 are illustrated as single straight columns through package substrate 1406 for ease of illustration, although other configurations can be used (e.g., damascene, dual damascene, through-silicon via, or an interconnect structure that meanders through the thickness of substrate 1406 to contact one or more intermediate locations therein). In still other embodiments, vias 1410 are fabricated by multiple smaller stacked vias, or are staggered at different locations across package substrate 1406. In the illustrated embodiment, contacts 1412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1412, to inhibit shorting.

In some embodiments, a mold material 1414 may be disposed around the one or more dies 1402 included within housing 1404 (e.g., between dies 1402 and package substrate 1406 as an underfill material, as well as between dies 1402 and housing 1404 as an overfill material). Although the dimensions and qualities of the mold material 1414 can vary from one embodiment to the next, in some embodiments, a thickness of mold material 1414 is less than 1 millimeter. Example materials that may be used for mold material 1414 include epoxy mold materials, as suitable. In some cases, the mold material 1414 is thermally conductive, in addition to being electrically insulating.

Methodology

Figure 15:
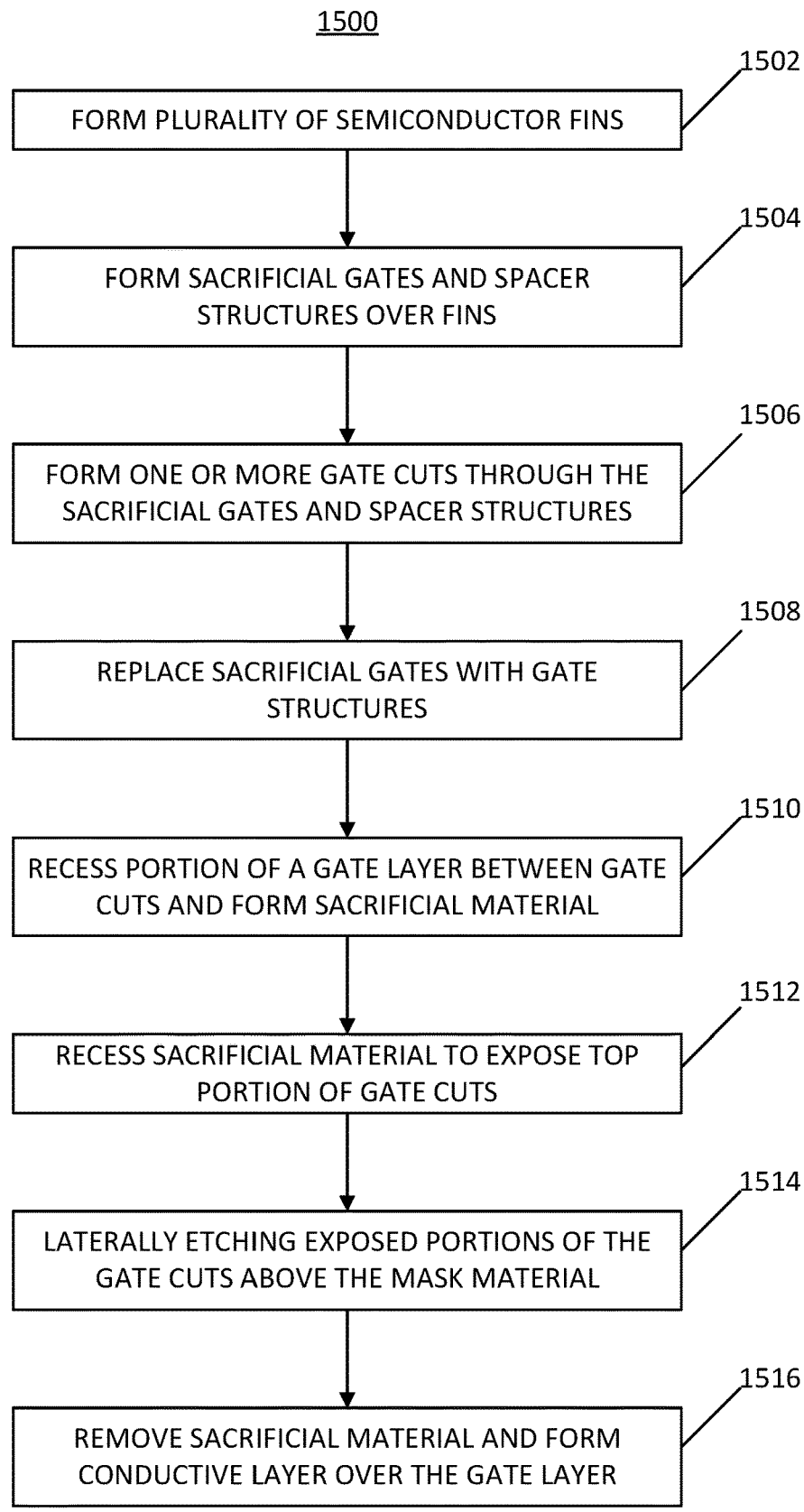
FIG. 15 is a flowchart of a fabrication process for a semiconductor device having angled gate cut structures, in accordance with an embodiment of the present disclosure.

FIG. 15 is a flow chart of a method 1500 for forming at least a portion of an integrated circuit, according to an embodiment. Various operations of method 1500 may be illustrated in FIGS. 2A-13A and 2B-13B. However, the correlation of the various operations of method 1500 to the specific components illustrated in the aforementioned figures is not intended to imply any structural and/or use limitations. Rather, the aforementioned figures provide one example embodiment of method 1500. Other operations may be performed before, during, or after any of the operations of method 1500. For example, method 1500 does not explicitly describe many steps that are performed to form common transistor structures. Some of the operations of method 1500 may be performed in a different order than the illustrated order.

Method 1500 begins with operation 1502 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

Method 1500 continues with operation 1504 where sacrificial gates are formed over the fins and spacer structures are formed on sidewalls of the sacrificial gates. The sacrificial gates may be patterned using gate masking layers in strips that run orthogonally over the fins and parallel to one another (e.g., forming a cross-hatch pattern). The gate masking layers may be any suitable hard mask material, such as CHM or silicon nitride. The sacrificial gates themselves may be formed from any suitable material that can be selectively removed at a later time without damaging the semiconductor material of the fins. In one example, the sacrificial gates include polysilicon.

The spacer structures may be deposited and then etched back such that the spacer structures remain mostly only on sidewalls of any exposed structures. In some cases, spacer structures may also be formed along sidewalls of the exposed fins running orthogonally between the strips of sacrificial gates. According to some embodiments, the spacer structures may be any suitable dielectric material, such as silicon nitride or silicon oxynitride.

Method 1500 continues with operation 1506 where any number of gate cut structures are formed through the sacrificial gates and spacer structures. The gate cut structures may extend through an entire thickness of the sacrificial gate. An anisotropic etching process may be performed to etch a recess through the sacrificial gate and adjacent spacer structures until a top surface of the underlying dielectric layer is reached. The gate cut structures may be formed within the etched recesses by depositing any number of dielectric materials. In some examples, the gate cut structures include silicon oxide, silicon nitride, or silicon oxynitride. Other low-K dielectric materials may be used as well. Any of the gate cut structures may be continuous structures that stretch across more than one sacrificial gate.

Method 1500 continues with operation 1508 where the sacrificial gates are removed and replaced with gate structures. The sacrificial gates may be removed using an isotropic etching process that selectively removes all of the material from the sacrificial gates, thus exposing the various fins between sets of spacer structures. In the example case where GAA transistors are used, any sacrificial layers within the exposed fins between the spacer structures may also be removed to leave behind nanoribbons, nanosheets, or nanowires of semiconductor material.

The gate structures may each include both a gate dielectric and a gate layer. The gate dielectric is first formed over the exposed semiconductor regions between the spacer structures followed by forming the gate layer within the remainder of the gate trench between the spacer structures, according to some embodiments. The gate dielectric may include any number of dielectric layers deposited using a CVD process, such as ALD. The gate layer can include any conductive material, such as a metal, metal alloy, or polysilicon. The gate layer may be deposited using electroplating, electroless plating, CVD, ALD, PECVD, or PVD, to name a few examples.

According to some embodiments, each of the gate structures is formed over the semiconductor regions of any number of semiconductor devices between gate cut structures. Following the formation of the gate structures, the entire structure may be polished such that the top surface of the gate structures is planar with the top surface of at least the spacer structures.

Method 1500 continues with operation 1510 where a portion of the gate layer between gate cut structures is recessed and a sacrificial material is formed within the recess. In some embodiments, the gate layer is recessed between about 10 nm and about 20 nm, or recessed up to 30 nm. In some embodiments, the gate layer is recessed to any depth so long as the top surface of the semiconductor regions (e.g. nanoribbons) are not exposed. The gate layer material may be removed using an isotropic etching process that selectively removes the conductive material of the gate layer. According to some embodiments, any exposed portions of the gate dielectric along the sidewalls of the gate cut structures are also removed using, for example, an isotropic etching process.

In some embodiments, the sacrificial material is any suitable material that can be easily removed at a later time without damaging other surrounding structures. In one example, the sacrificial material is a carbon hard mask (CHM). According to some embodiments, the sacrificial material is only formed within the gate trenches between the gate cut structures.

Method 1500 continues with operation 1512 where the sacrificial material is recessed thus exposing top portions of the gate cut structures. The sacrificial material may be recessed by any amount so long as some of it still remains to cover the top surface of the gate layer. An isotropic etching process may be performed to recess the sacrificial material and expose top portions of the gate cut structures.

Method 1500 continues with operation 1514 where the exposed top portions of the gate cut structures are laterally etched to reduce the width of the top portions of the gate cut structures. An angled anisotropic etch may be performed to preferentially remove material from the sides of the exposed portions of the gate cut structures above the top surface of the sacrificial material. The angled etch may result in a shoulder or step-like feature marking an abrupt change in the width of the gate cut structures. According to some embodiments, these shoulder or step-like features may be located at substantially the same level as the top surface of the sacrificial material. Any lateral etch technique may be used. Some etches may be more isotropic in nature which can yield a sloped profile to the exposed sidewalls of the gate cut structures.

Method 1500 continues with operation 1516 where the sacrificial material is removed and a conductive layer is formed over the gate layer between the gate cut structures. The conductive layer may have the same composition as the gate layer (or at least a fill metal portion of the gate layer). The conductive layer and gate layer may together form a single gate electrode. A seam may or may not be present between the conductive layer and the gate layer depending on the materials used and deposition process used to form the conductive layer.

It should be noted that the process described in method 1500 for forming angled gate cut structures may be used at other locations of the integrated circuit to form any angled dielectric structures. For example, the same process may be carried out on dielectric plugs (e.g., dielectric fill 604) between adjacent source or drain epitaxial regions when forming conductive contacts over the source or drain regions. Accordingly, angled etches may be performed to reduce the top width of the dielectric plugs and correspondingly allow for wider top surfaces of the conductive contacts formed over the source or drain regions.

Example System

Figure 16:
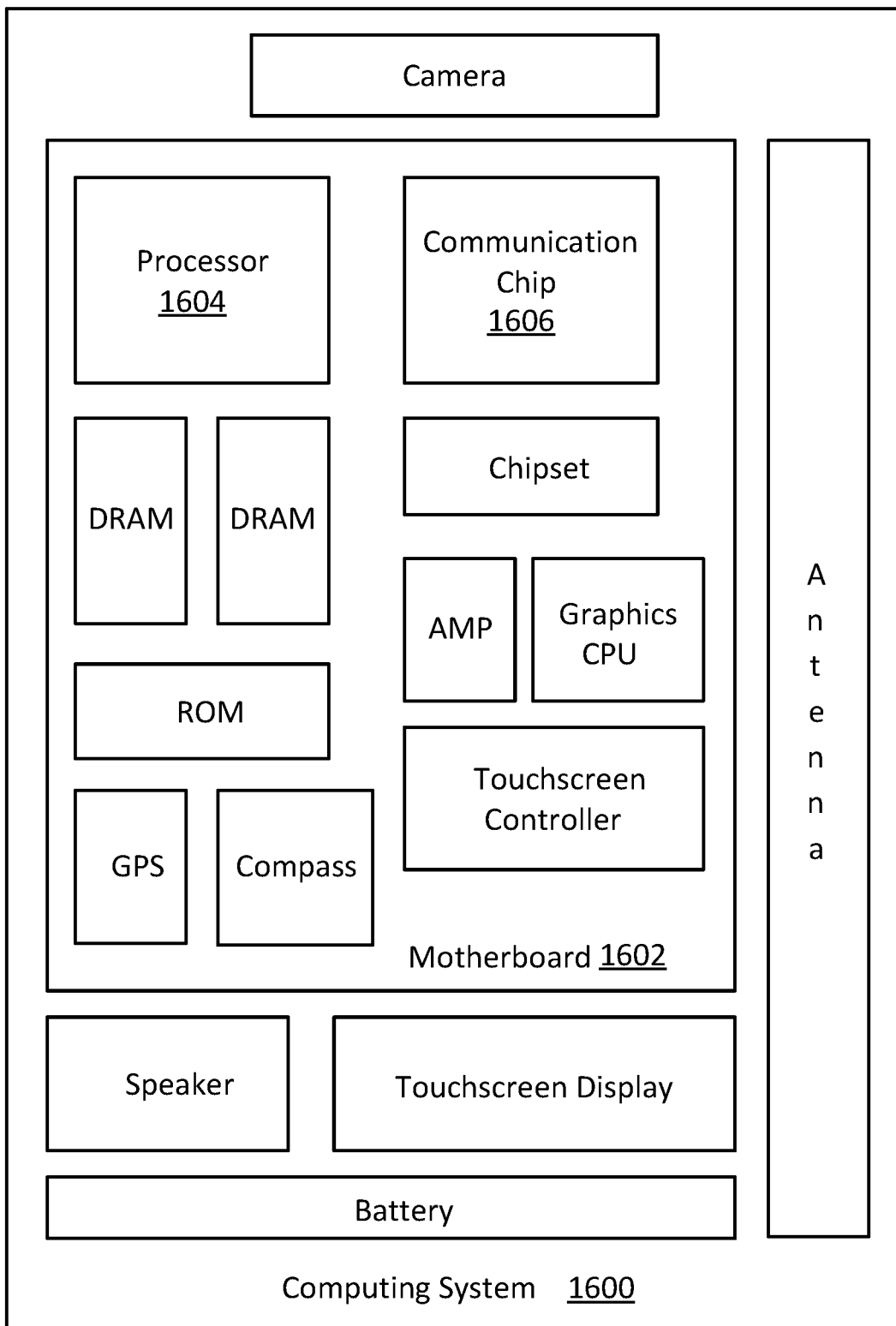
FIG. 16 illustrates a computing system including one or more integrated circuits, as variously described herein, in accordance with an embodiment of the present disclosure.

FIG. 16 is an example computing system implemented with one or more of the integrated circuit structures as disclosed herein, in accordance with some embodiments of the present disclosure. As can be seen, the computing system 1600 houses a motherboard 1602. The motherboard 1602 may include a number of components, including, but not limited to, a processor 1604 and at least one communication chip 1606, each of which can be physically and electrically coupled to the motherboard 1602, or otherwise integrated therein. As will be appreciated, the motherboard 1602 may be, for example, any printed circuit board (PCB), whether a main board, a daughterboard mounted on a main board, or the only board of system 1600, etc.

Depending on its applications, computing system 1600 may include one or more other components that may or may not be physically and electrically coupled to the motherboard 1602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1600 may include one or more integrated circuit structures or devices configured in accordance with an example embodiment (e.g., a module including an integrated circuit device on a substrate, the substrate having one or more semiconductor devices with angled gate cut structures, as variously provided herein). In some embodiments, multiple functions can be integrated into one or more chips (e.g., for instance, note that the communication chip 1606 can be part of or otherwise integrated into the processor 1604).

The communication chip 1606 enables wireless communications for the transfer of data to and from the computing system 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing system 1600 includes an integrated circuit die packaged within the processor 1604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1606 also may include an integrated circuit die packaged within the communication chip 1606. In accordance with some such example embodiments, the integrated circuit die of the communication chip includes one or more semiconductor devices as variously described herein. As will be appreciated in light of this disclosure, note that multi-standard wireless capability may be integrated directly into the processor 1604 (e.g., where functionality of any chips 1606 is integrated into processor 1604, rather than having separate communication chips). Further note that processor 1604 may be a chip set having such wireless capability. In short, any number of processor 1604 and/or communication chips 1606 can be used. Likewise, any one chip or chip set can have multiple functions integrated therein.

In various implementations, the computing system 1600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1600 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a semiconductor device having a semiconductor region extending between a source region and a drain region, a gate layer comprising a conductive material and extending over the semiconductor region, and a gate cut structure comprising a dielectric material and adjacent to the semiconductor region such that the gate cut structure interrupts the gate layer. The gate cut structure has a first width along a first plane that extends through the semiconductor region and a second width along a second plane parallel to the first plane and above the semiconductor region where the first width is greater than the second width.

Example 2 includes the subject matter of Example 1, wherein the semiconductor region is a fin that comprises silicon.

Example 3 includes the subject matter of Example 1, wherein the semiconductor region includes one or more semiconductor nanoribbons.

Example 4 includes the subject matter of Example 3, wherein the one or more semiconductor nanoribbons comprises germanium, silicon, or a combination thereof.

Example 5 includes the subject matter of any one of Examples 1-4, wherein the dielectric material comprises silicon and nitrogen, or silicon and oxygen.

Example 6 includes the subject matter of any one of Examples 1-5, wherein the gate cut structure is a first gate cut structure and the semiconductor region is a first semiconductor region, and the integrated circuit comprises a second gate cut structure adjacent to a second semiconductor region.

Example 7 includes the subject matter of Example 6, wherein the first semiconductor region, the second semiconductor region, the first gate cut structure, and the second gate cut structure each extends lengthwise in a first direction.

Example 8 includes the subject matter of Example 6 or 7, wherein the gate layer has a first width along the first plane between the first gate cut structure and the second gate cut structure and a second width along the second plane between the first gate cut structure and the second gate cut structure, the second width being greater than the first width.

Example 9 includes the subject matter of any one of Examples 1-8, wherein the gate cut structure comprises a shoulder or step-like feature at a location where a width of the gate cut structure transitions between the first width and the second width.

Example 10 includes the subject matter of any one of Examples 1-9, wherein the gate cut structure abruptly transitions between the first width and the second width, such that the transition occurs over a distance of 2 nanometers or less.

Example 11 includes the subject matter of any one of Examples 1-10, comprising a plug structure comprising a dielectric material, the plug structure being adjacent to the source or drain region such that the plug structure isolates the source or drain region from a neighboring source or drain region, wherein the plug structure has a first width along the first plane and a second width along the second plane, the first width of the plug structure being greater than the second width of the plug structure.

Example 12 is a printed circuit board comprising the integrated circuit of any one of Examples 1-11.

Example 13 is an electronic device that includes a chip package having one or more dies. At least one of the one or more dies includes one or more semiconductor devices having one or more corresponding semiconductor regions extending between corresponding source regions and drain regions, a gate layer comprising a conductive material and extending over the one or more semiconductor regions, and a gate cut structure comprising a dielectric material and being adjacent to at least one of the one or more semiconductor regions such that the gate cut structure interrupts the gate layer. The gate cut structure has a first width along a first plane that extends through the one or more semiconductor regions and a second width along a second plane parallel to the first plane and above the one or more semiconductor regions, where the first width is greater than the second width.

Example 14 includes the subject matter of Example 13, wherein the one or more semiconductor regions are fins that comprise silicon.

Example 15 includes the subject matter of Example 13, wherein the one or more semiconductor regions each comprise a plurality of semiconductor nanoribbons.

Example 16 includes the subject matter of Example 15, wherein the plurality of semiconductor nanoribbons comprise germanium, silicon, or a combination thereof.

Example 17 includes the subject matter of any one of Examples 13-16, wherein the dielectric material comprises silicon and nitrogen or comprises silicon and oxygen.

Example 18 includes the subject matter of any one of Examples 13-17, wherein the gate cut structure is a first gate cut structure adjacent to a first semiconductor region and the at least one of the one or more dies further comprises a second gate cut structure adjacent to a second semiconductor region.

Example 19 includes the subject matter of Example 18, wherein the first semiconductor region, the second semiconductor region, the first gate cut structure, and the second gate cut structure each extends lengthwise in a first direction.

Example 20 includes the subject matter of Example 18 or 19, wherein the gate layer has a first width along the first plane between the first gate cut structure and the second gate cut structure and a second width along the second plane between the first gate cut structure and the second gate cut structure, the second width being greater than the first width.

Example 21 includes the subject matter of any one of Examples 13-20, wherein the gate cut structure comprises a shoulder at a location where a width of the gate cut structure transitions between the first width and the second width.

Example 22 includes the subject matter of any one of Examples 13-21, further comprising a printed circuit board, wherein the chip package is attached to the printed circuit board.

Example 23 is a method of forming an integrated circuit. The method includes forming a plurality of fins comprising semiconductor material, wherein the plurality of fins extend parallel to one another; forming a sacrificial gate layer over the semiconductor material of the plurality of fins; forming a gate cut structure comprising a dielectric material through the sacrificial gate layer; replacing the sacrificial gate layer with a first conductive gate layer; recessing a portion of the conductive gate layer adjacent to the gate cut structure; forming mask material over the conductive gate layer; laterally etching an exposed portion of the gate cut structure above a top surface of the mask material; and removing the mask material and forming a second conductive gate layer on the first conductive layer and adjacent to the laterally etched portion of the gate cut structure.

Example 24 includes the subject matter of Example 23, wherein forming the plurality of fins comprises recessing a dielectric layer between the plurality of fins such that the plurality of fins extend above a top surface of the dielectric layer.

Example 25 includes the subject matter of Example 23 or 24, wherein a first width of the gate cut structure beneath a top surface of the first conductive gate layer is greater than a second width of the gate cut structure above the top surface of the first conductive gate layer.

Example 26 includes the subject matter of any one of Examples 23-25, wherein the first conductive gate layer and the second conductive gate layer comprise the same material.

Example 27 includes the subject matter of any one of Examples 23-26, wherein the gate cut structure is a first gate cut structure and the method further comprises forming a second gate cut structure through the sacrificial gate layer.

Example 28 includes the subject matter of Example 27, wherein the first conductive gate layer has a first width between the first gate cut structure and the second gate cut structure and the second conductive gate layer has a second width between the first gate cut structure and the second gate cut structure, the second width being greater than the first width.

Example 29 is an integrated circuit that includes one or more semiconductor devices having one or more semiconductor regions extending between corresponding source regions and drain regions, a gate layer comprising a conductive material and extending over the one or more semiconductor regions, a first gate cut structure comprising a first dielectric material, and a second gate cut structure comprising a second dielectric material. The first gate cut structure is adjacent to at least one of the one or more semiconductor regions such that the first gate cut structure interrupts the gate layer and the second gate cut structure is adjacent to at least one of the one or more semiconductor regions such that the second gate cut structure interrupts the gate layer. The gate layer has a first width between the first gate cut structure and the second gate cut structure along a first plane that extends through the one or more semiconductor regions and a second width along a second plane parallel to the first plane and above the one or more semiconductor regions between the first gate cut structure and the second gate cut structure where the second width is greater than the first width.

Example 30 includes the subject matter of Example 29, wherein the one or more semiconductor regions are fins that comprise silicon.

Example 31 includes the subject matter of Example 29, wherein the one or more semiconductor regions each comprise a plurality of semiconductor nanoribbons.

Example 32 includes the subject matter of Example 31, wherein the plurality of semiconductor nanoribbons comprise germanium, silicon, or a combination thereof.

Example 33 includes the subject matter of any one of Examples 29-32, wherein the first and second dielectric materials comprise silicon and nitrogen or comprises silicon and oxygen.

Example 34 includes the subject matter of any one of Examples 29-33, wherein the one or more semiconductor regions, the first gate cut structure, and the second gate cut structure each extends lengthwise in a first direction and the gate layer extends lengthwise in a second direction orthogonal to the first direction.

Example 35 includes the subject matter of any one of Examples 29-34, wherein each of the first gate cut structure and the second gate cut structure comprises a shoulder at a location where a width of the gate layer transitions between the first width and the second width.

Example 36 is a printed circuit board comprising the integrated circuit of any one of Examples 29-35.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
    a semiconductor device having a semiconductor region extending between a source region and a drain region;
    a gate layer comprising a conductive material, the gate layer extending over the semiconductor region; and
    a gate cut structure comprising a dielectric material, the gate cut structure being adjacent to the semiconductor region such that the gate cut structure interrupts the gate layer, wherein the gate cut structure has a first width along a first plane that extends through the semiconductor region and a second width along a second plane parallel to the first plane and above the semiconductor region, the first width being greater than the second width.

2. The integrated circuit of claim 1, wherein the semiconductor region includes one or more semiconductor nanoribbons.

3. The integrated circuit of claim 1, wherein the dielectric material comprises silicon and nitrogen, or silicon and oxygen.

4. The integrated circuit of claim 1, wherein the gate cut structure is a first gate cut structure and the semiconductor region is a first semiconductor region, and the integrated circuit comprises a second gate cut structure adjacent to a second semiconductor region.

5. The integrated circuit of claim 4, wherein the first semiconductor region, the second semiconductor region, the first gate cut structure, and the second gate cut structure each extends lengthwise in a first direction.

6. The integrated circuit of claim 4, wherein the gate layer has a first width along the first plane between the first gate cut structure and the second gate cut structure and a second width along the second plane between the first gate cut structure and the second gate cut structure, the second width being greater than the first width.

7. The integrated circuit of claim 1, wherein the gate cut structure comprises a shoulder or step-like feature at a location where a width of the gate cut structure transitions between the first width and the second width.

8. The integrated circuit of claim 1, wherein the gate cut structure abruptly transitions between the first width and the second width, such that the transition occurs over a distance of 2 nanometers or less.

9. The integrated circuit of claim 1, comprising a plug structure comprising a dielectric material, the plug structure being adjacent to the source or drain region such that the plug structure isolates the source or drain region from a neighboring source or drain region, wherein the plug structure has a first width along the first plane and a second width along the second plane, the first width of the plug structure being greater than the second width of the plug structure.

10. A printed circuit board comprising the integrated circuit of claim 1.

11. An electronic device, comprising:
a chip package comprising one or more dies, at least one of the one or more dies comprising one or more semiconductor devices having one or more corresponding semiconductor regions extending between corresponding source regions and drain regions;
a gate layer comprising a conductive material, the gate layer extending over the one or more semiconductor regions; and
a gate cut structure comprising a dielectric material, the gate cut structure being adjacent to at least one of the one or more semiconductor regions such that the gate cut structure interrupts the gate layer, wherein the gate cut structure has a first width along a first plane that extends through the one or more semiconductor regions and a second width along a second plane parallel to the first plane and above the one or more semiconductor regions, the first width being greater than the second width.

12. The electronic device of claim 11, wherein the one or more semiconductor regions each comprise a plurality of semiconductor nanoribbons.

13. The electronic device of claim 11, wherein the gate cut structure is a first gate cut structure adjacent to a first semiconductor region and the at least one of the one or more dies further comprises a second gate cut structure adjacent to a second semiconductor region.

14. The electronic device of claim 13, wherein the gate layer has a first width along the first plane between the first gate cut structure and the second gate cut structure and a second width along the second plane between the first gate cut structure and the second gate cut structure, the second width being greater than the first width.

15. The electronic device of claim 11, wherein the gate cut structure comprises a shoulder at a location where a width of the gate cut structure transitions between the first width and the second width.

16. An integrated circuit comprising:
one or more semiconductor devices having one or more corresponding semiconductor regions extending between corresponding source regions and drain regions;
a gate layer comprising a conductive material, the gate layer extending over the one or more semiconductor regions;
a first gate cut structure comprising a first dielectric material, the first gate cut structure being adjacent to at least one of the one or more semiconductor regions such that the first gate cut structure interrupts the gate layer; and
a second gate cut structure comprising a second dielectric material, the second gate cut structure being adjacent to at least one of the one or more semiconductor regions such that the second gate cut structure interrupts the gate layer;
wherein the gate layer has a first width between the first gate cut structure and the second gate cut structure along a first plane that extends through the one or more semiconductor regions and a second width along a second plane above the one or more semiconductor regions between the first gate cut structure and the second gate cut structure, the second width being greater than the first width.

17. The integrated circuit of claim 16, wherein the one or more semiconductor regions each comprise a plurality of semiconductor nanoribbons.

18. The integrated circuit of claim 16 wherein the one or more semiconductor regions, the first gate cut structure, and the second gate cut structure each extends lengthwise in a first direction and the gate layer extends lengthwise in a second direction orthogonal to the first direction.

19. The integrated circuit of claim 16, wherein each of the first gate cut structure and the second gate cut structure comprises a shoulder at a location where a width of the gate layer transitions between the first width and the second width.

20. A printed circuit board comprising the integrated circuit of claim 16.

* * * * *